(12) United States Patent
Degli-Esposti et al.

(10) Patent No.: US 10,372,840 B2
(45) Date of Patent: Aug. 6, 2019

(54) SIMPLIFICATION OF DATA FOR REPRESENTING AN ENVIRONMENT VIA THE EXPANSION OF POLYHEDRONS THAT DEFINE STRUCTURES REPRESENTED IN THE DATA

(71) Applicant: Polaris Wireless, Inc., Mountain View, CA (US)

(72) Inventors: Vittorio Degli-Esposti, Mountain View, CA (US); Jonathan Lu, San Jose, CA (US); Enrico Maria Vitucci, Rimini (IT)

(73) Assignee: Polaris Wireless, Inc., Mountain View, CA (US)

( * ) Notice: Subject to any disclaimer, the term of this patent is extended or adjusted under 35 U.S.C. 154(b) by 219 days.

(21) Appl. No.: 15/266,759

(22) Filed: Sep. 15, 2016

(65) Prior Publication Data

US 2019/0050500 A1    Feb. 14, 2019

(51) Int. Cl.
 *F21V 17/10* (2006.01)
 *G06F 17/50* (2006.01)
 *G06T 15/20* (2011.01)

(52) U.S. Cl.
 CPC .......... *G06F 17/5004* (2013.01); *F21V 17/10* (2013.01); *G06T 15/20* (2013.01)

(58) Field of Classification Search
 CPC ...... G06Q 10/06; G06Q 50/163; G06V 11/00; B64C 3/48; H04N 1/6097; G06F 17/5081
 See application file for complete search history.

(56) References Cited

U.S. PATENT DOCUMENTS

| | | | |
|---|---|---|---|
| 5,675,720 A | 10/1997 | Sato et al. | |
| 6,037,945 A * | 3/2000 | Loveland | G06Q 10/06 345/420 |
| 6,070,373 A | 6/2000 | Diamond | |
| 2002/0033835 A1* | 3/2002 | Sowizral | G06T 15/405 345/645 |
| 2004/0105573 A1 | 6/2004 | Neumann | |

(Continued)

OTHER PUBLICATIONS

Office action dated Sep. 20, 2018, U.S. Appl. No. 15/266,899.

(Continued)

*Primary Examiner* — Kandasamy Thangavelu
(74) *Attorney, Agent, or Firm* — McGeary Cukor LLC; Kenneth Ottesen; Jason Paul DeMont

(57) ABSTRACT

A technique for simplifying structure data for representing an environment. Polyhedrons can make up structure data used in an application such as modeling, visualization, and navigation. Consequently, the operations that are performed on the data often involve determining, for each polyhedron that defines a structure such as a building, whether the polyhedron obstructs a line-of-sight line between a first point in space being considered in the application and a second point. In order to determine whether a polyhedron obstructs a line-of-sight line, a data-processing system operating on the structure data must determine whether any walls of the polyhedron intersect the line. Thus, the more polyhedrons there are or the more vertices that are in each polyhedron, the more walls there are, and the more intersection checks are required, thereby adding to the computations. The disclosed technique reduces the number of walls by simplifying objects that make up the structure data.

20 Claims, 18 Drawing Sheets

(56) References Cited

U.S. PATENT DOCUMENTS

| | | | |
|---|---|---|---|
| 2009/0043504 A1 | 2/2009 | Bandyopadhyay et al. | |
| 2010/0118029 A1 | 5/2010 | Khulusi | |
| 2010/0224734 A1* | 9/2010 | Grip | B64C 3/48 244/219 |
| 2012/0229445 A1* | 9/2012 | Jenkins | G06T 15/60 345/418 |
| 2012/0306693 A1 | 12/2012 | Edge | |
| 2013/0321872 A1* | 12/2013 | Shimada | H04N 1/6097 358/3.23 |
| 2014/0136171 A1* | 5/2014 | Sword, Jr. | G01V 11/00 703/10 |
| 2015/0314443 A1 | 11/2015 | Yu | |
| 2016/0039164 A1 | 2/2016 | Tuczek | |
| 2016/0110823 A1* | 4/2016 | Wood | G06Q 50/163 705/314 |
| 2016/0253449 A1* | 9/2016 | Lim | G06F 17/5081 716/55 |

OTHER PUBLICATIONS

Office action dated Aug. 31, 2018, U.S. Appl. No. 15/266,834.
Office action dated Nov. 29, 2018, U.S. Appl. No. 15/266,834.
Office action dated Dec. 4, 2018, U.S. Appl. No. 15/266,899.
USPTO "Notice of Allowance and Fee(s) Due" dated May 1, 2019, U.S. Appl. No. 15/266,899.
Office action dated Jul. 19, 2018, U.S. Appl. No. 15/266,899.

* cited by examiner

600

SIMPLIFICATION OF DATA FOR REPRESENTING AN ENVIRONMENT VIA THE EXPANSION OF POLYHEDRONS THAT DEFINE STRUCTURES REPRESENTED IN THE DATA

CROSS REFERENCE TO RELATED APPLICATIONS

This application is related to "Simplification of data for representing an environment, via the reduction of vertices that define structures represented in the data," U.S. application Ser. No. 15/266,834, and "Simplification of data for representing an environment, based on the heights and elevations of polyhedrons that define structures represented in the data," U.S. application Ser. No. 15/266,899, both filed on the same day as the present application and incorporated by reference herein.

FIELD OF THE INVENTION

The present invention relates to representation of an environment in general, and, more particularly, to the simplification of data for representing an environment, via the expansion of polyhedrons that define structures such as buildings that are represented in the data.

BACKGROUND OF THE INVENTION

Various applications use data that represent a particular environment. One example of such an application involves the modeling of electromagnetic wave propagation throughout an environment that includes buildings and possibly other types of structures. Wave propagation modeling can be performed for various reasons, including a need to understand existing telecommunications system coverage and a need to predict potential coverage configurations.

The structure data that is used in such modeling, as well as in other applications, is often specified in terms of polyhedrons, in which one or more polyhedrons make up each building or other type of structure. Each polyhedron, in turn, can be defined by both an ordered set of vertices and a height. Each vertex in the ordered set can be represented using coordinates, and the set itself defines a polygon footprint of the polyhedron being defined. Some of these types of polyhedrons are referred to as "prisms" that have a polygon footprint and vertical walls.

Structure data, including that of buildings, is typically created from satellite imagery or other imagery captured from a reconnaissance point that scans the various structures in the environment. Because the limitations of the source of the structure data are well understood and quantifiable, the data itself can be characterized as being at a particular resolution of detail. Similarly, the data can be also characterized in terms of horizontal and/or vertical accuracies, in that each point (e.g., vertex, etc.) specified can deviate from its true position according to a specified accuracy.

The operations that are performed, by at least some applications, on data that represent an environment can include checking for visibility of a first point in space from a second point and checking for the obstruction of the first point in relation to the second point, to name a few operations. The operations that are performed on the data are often computationally intensive, however, and can require large amounts of computer-processing resources, such as instruction cycles, memory, and input-output operations.

SUMMARY OF THE INVENTION

When one or more polyhedrons make up structure data used for representing an environment, the operations that are performed on the data often involve determining, for each polyhedron that defines a structure such as a building, whether the polyhedron obstructs a line-of-sight line between a first point in space being considered in an application and a second point. In order to determine whether a polyhedron obstructs a line-of-sight line, a data-processing system operating on the structure data must determine whether any walls of the polyhedron intersect the line. Thus, the more vertices that are in the polyhedron, the more walls there are, and the more intersection checks are required, thereby adding to the computations that are required of the data-processing system.

Similarly, the more polyhedrons there are for defining each structure or structures, the more walls there are, and the more intersection checks are required, thereby adding to the computations that are required of the data-processing system. Furthermore, each structure can be defined with multiple polyhedrons of different heights, in terms of their measurements from base to top. Consequently, a line between the two points might pass through many walls, where the number of walls varies by elevation in terms of height above a given level (e.g., mean sea level, etc.), even though the outer walls of each structure being represented are often the only walls that must be considered during the use of the structure data.

Thus, it is important to manage the walls that are represented in a dataset that contains structure data for representing an environment (i.e., "environment data"), at least from a computational perspective.

The present invention enables an improvement in the functioning of a data-processing system that uses environment data, in applications such as but not limited to modeling, visualization, and navigation, and without at least some of the disadvantages in the prior art. In particular, embodiments of the present invention form a consolidated polygon footprint to define a consolidated polyhedron, from two or more constituent polygon footprints defining constituent polyhedrons in the structure data. In doing so, the number of polyhedrons that need to be considered while using the environment data is reduced. As a result, fewer computations are required by applications that use the simplified environment data, and, by association, fewer resources are utilized by a computer executing such applications. Furthermore, such an improvement in the functioning of the computer, or other data-processing system, is achieved without sacrificing the quality of the subsequent application of the environment data. As an added benefit, the simplification techniques disclosed herein can be performed offline and, depending on how the environment data is to be used, need be performed only once.

The inventors had an insight, which when applied to a use of the environment data achieves the aforementioned improvement without a sacrifice in quality, as explained here. It is already known that in the field of modeling electromagnetic waves propagating through a region occupied by buildings, the techniques of modeling the particular environment utilize building data having a known error. For example, such building data can be based upon satellite data, which is specified as being accurate to within a particular resolution of detail (e.g., 2 meters, 5 meters, 20 meters, 30 meters, etc.). In accordance with the illustrative embodiment of the present invention, and based on the inventors' insight, the techniques disclosed herein account for the resolution of the building data. In particular, each polygon footprint is first expanded, in which the amount of expansion is based on the resolution of the building data. For example, the coarser the data resolution, the greater the footprint expansion that can be tolerated. Then, the expanded polygon footprints are tested to determine whether the expanded footprints overlap each other. Overlapping footprints are then combined, thereby consolidating the number of individual polygon footprints and, as a result, the polyhedrons defined by those footprints.

In forming new polyhedrons from individual polyhedrons in this way, the disclosed techniques are able to achieve a reduction in the number of polyhedrons that must be processed, thereby improving the functioning of the computer. And, as the inventors realized, by limiting the expansion of each constituent polygon footprint to a factor that is based on the resolution of the data, the disclosed technique accomplishes the reduction in the number of polyhedrons without increasing the error of the representation of an environment beyond that which was already present in the building data, thereby maintaining the quality of the particular use of the building data. Furthermore, the improvement that is achieved applies not only to an improvement in the dataset itself, but also applies to the technology that is used in support of various applications such as, while not being limited to, i) electromagnetic wave propagation modeling, ii) gaming, and iii) navigation (e.g., of drones, of self-drive vehicles, of vehicles in general, of other things used for transportation, etc.). Based on further insights of the inventors, the data-processing system can maintain the expanded footprint of a consolidated polyhedron during the use of the simplified environment data and without a loss in quality, in some embodiments of the present invention.

In some embodiments of the present invention, the technique for reducing the number of polyhedrons via footprint expansion that is disclosed herein can be used in conjunction with reducing the number of vertices that are required to represent one or more structures in the dataset, thereby reducing further the total number of walls, the number of intersection checks that need to be performed, and the computations that are required of the data-processing system. The technique for reducing the number of polyhedrons can also consider how the polyhedrons overlap vertically, in addition to consolidating the horizontal footprint.

A first illustrative method for simplifying the representation of structures in data for representing an environment comprises: receiving, by a data-processing system, a first dataset that is representative of a structure defined by a first polyhedron having a first polygon footprint, wherein the first dataset is characterized as having a predetermined error; expanding, by the data-processing system, the first polygon footprint by a factor that is based on the predetermined error, resulting in a first expanded polygon footprint; forming, by the data-processing system, a third polygon footprint based on determining whether the first expanded polygon footprint and a second polygon footprint in the first dataset overlap each other; and transmitting, by the data-processing system to an application engine, a second dataset that comprises a second polyhedron, wherein the second polyhedron has a footprint that comprises the third polygon footprint.

A second method for simplifying the representation of structures in data for representing an environment comprises: receiving, by a data-processing system, a first dataset that is representative of a structure defined by a first polyhedron having a first polygon footprint; expanding, by the data-processing system, i) the first polygon footprint, in part by moving a first vertex of the first polygon footprint based on a vector sum of the outward normals of adjacent edges of the first vertex, resulting in a first expanded polygon footprint, and ii) a second polygon footprint, resulting in a second expanded polygon footprint; forming, by the data-processing system, a third polygon footprint based on determining whether the first expanded polygon footprint and a second expanded polygon footprint in the first dataset overlap each other; and transmitting, by the data-processing system to an application engine, a second dataset that comprises a second polyhedron, wherein the second polyhedron has a footprint that comprises the third polygon footprint.

A third method for simplifying the representation of structures in data for representing an environment comprises: receiving, by a data-processing system, a first dataset representative of one or more structures defined by i) a first polyhedron having a first polygon footprint and ii) a second polyhedron having second polygon footprint, wherein the first dataset is characterized as having a predetermined error; expanding, by the data-processing system, the first polygon footprint and the second polygon footprint by a factor that is based on the predetermined error, resulting in first and second expanded polygon footprints, respectively; forming, by the data-processing system, a third polyhedron based on determining whether the first and second expanded polygon footprints overlap each other; and transmitting, by the data-processing system to an application engine, a second dataset that i) comprises the third polyhedron and ii) excludes the first and second polyhedrons.

DETAILED DESCRIPTION

Figure 1:
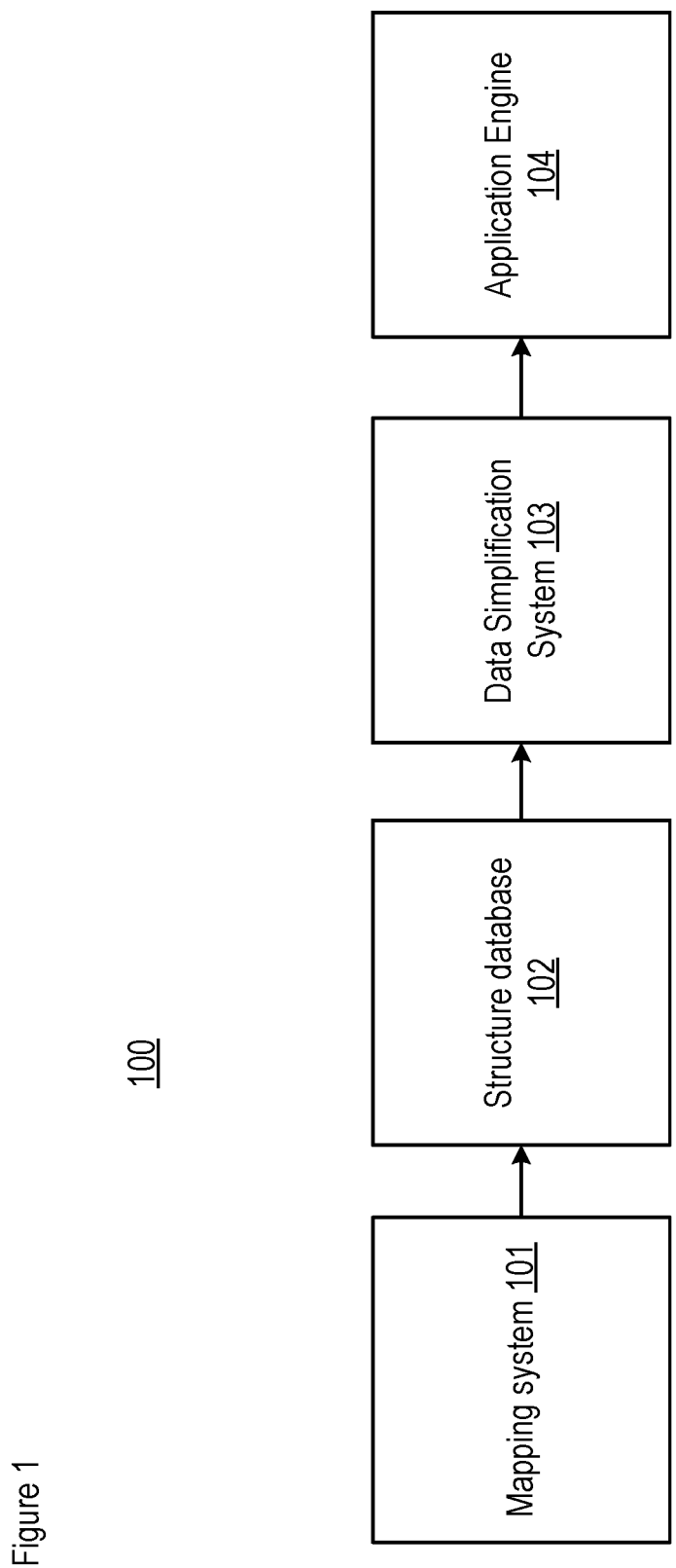
FIG. 1 depicts a diagram of the salient components of data creation and simplification system 100, in accordance with the illustrative embodiment of the present invention.

Based on—For the purposes of this specification, the phrase "based on" is defined as "being dependent on" in contrast to "being independent of". The value of Y is dependent on the value of X when the value of Y is different for two or more values of X. The value of Y is independent of the value of X when the value of Y is the same for all values of X. Being "based on" includes both functions and relations.

Dataset—For the purposes of this specification, the phrase "dataset" is defined as a collection of data. A dataset can originate from an organized collection of data, such as a database.

Edge—For the purposes of this specification, the phrase "edge" is defined as a line segment joining two vertices in a polygon or polyhedron.

Elevation—For the purposes of this specification, the phrase "elevation" is defined as height above a given level (e.g., ground, MSL, etc.). A "start elevation" is defined as the height of the lowest point on a polyhedron, while an "end elevation" is defined as the height of the highest point on a polyhedron. In some alternative embodiments of the present invention, the "start elevation" is defined as the height of the highest point on a polyhedron, while the "end elevation" is defined as the height of the lowest point on a polyhedron.

Environment—For the purposes of this specification, the phrase "environment" is defined as the aggregate of surrounding things, conditions, and/or influences.

Footprint—For the purposes of this specification, the phrase "footprint" is defined as the area on a surface covered by something, such as by a polyhedron that is representative of a structure in a dataset.

Height—For the purposes of this specification, the phrase "height" is defined as measurement from base to top. The height of an object, such as a polyhedron, is defined as measurement from the base of the object to the top of the object.

Overlap—to have an area or range in common with.

Polygon—For the purposes of this specification, the phrase "polygon" is defined as a closed plane figure having at least three sides (edges). In some embodiments of the present invention, the sides are straight.

Polyhedron—For the purposes of this specification, the phrase "polyhedron" is defined as a solid in three dimensions with flat polygonal faces, straight edges and sharp corners or vertices. A "neighbor polyhedron" is defined as a polyhedron that is within a predetermined distance from another polyhedron.

Structure—For the purposes of this specification, the phrase "structure" is defined as something built or constructed, such as a building, bridge, dam, or machine, for example and without limitation. For the purposes of this specification, the phrase "building" is defined as a structure with a roof and walls, such as a dwelling, house, school, store, or factory, for example and without limitation.

Vertex—For the purposes of this specification, the phrase "vertex" is defined as a point where two or more curves, lines, or edges meet.

Wall—For the purposes of this specification, the phrase "wall" is defined as a side of a building or room.

FIG. 1 depicts a diagram of the salient components of data creation and simplification system 100, in accordance with the illustrative embodiment of the present invention. Data creation and simplification system 100 comprises: mapping system 101, structure database 102, data simplification system 103, and application engine 104 which are interrelated as shown.

For illustrative purposes, system 100 includes the simplification of data representing one or more buildings within an environment and also processing of the simplified environment data in support of electromagnetic wave propagation modeling. As those who are skilled in the art will appreciate, however, after reading this specification, the data can represent structures that are different from buildings, or can represent other objects that are representable with polyhedrons. Furthermore, the use of the simplified data can for a purpose that is different than propagation modeling. For example and without limitation, embodiments of the present invention can be applied to visualization (e.g., used in gaming programs, etc.), other types of modeling, simulation, prediction, navigation, computer-aided design (e.g., for urban planning, etc.), and so on.

The type of polyhedron that is handled by system 100 in the illustrative embodiment is a "right prism." A right prism is a geometric solid that has a polygon as its base and vertical sides perpendicular to the base. As those who are skilled in the art will appreciate after reading this specification, however, at least some other types of polyhedrons that are different from right prisms can be handled by at least some of the techniques disclosed herein; such polyhedrons include oblique prisms and non-prismatic polyhedrons, for example and without limitation. Furthermore, as those who are skilled in the art will appreciate after reading this specification, at least some other types of solids in three dimensions that are different than polyhedrons can be handled by at least some of the techniques disclosed herein; such geometric solids include cylinders, cones, spheres, and tori, for example and without limitation. As a non-limiting example, the circular base of a cylinder, cone, hemisphere, or hemi-torus can be used instead of the polygonal base of a polyhedron (i.e., a "circular footprint" instead of a "polygon footprint" as described below), in some alternative embodiments of the present invention.

Mapping system 101 is responsible for the creation of structure data, in well-known fashion. System 101 features the capture of imagery of buildings and/or other terrestrial structures and details. System 101 comprises hardware and software that provides imagery over a given terrestrial surface area. The imaging devices include imaging satellites and unmanned aerial vehicles (UAV) such as macro UAVs and micro drones, for example and without limitation.

Structure database 102 is responsible for receiving and maintaining one or more datasets of structure data, in well-known fashion. Database 102 features the organizing and storage of imagery of buildings and/or other terrestrial structures and details, in the form of polyhedrons. Database 102 comprises hardware and software that provides datasets of buildings and other structures. For example and without limitation, Database 102 can include at least a portion of a geographical information system (GIS) database as is known in the art. The type of data that can be provided to data simplification system 103 can comprise terrain data and building data.

Data simplification system 103 is responsible for the simplification of structures represented in a dataset, in accordance with the illustrative embodiment. System 103 comprises hardware and software that uses the structure data acquired from structure database 102, as described below and in the accompanying figures. System 103 is described below and with respect to FIG. 2.

In accordance with the illustrative embodiment, data simplification system 103 communicates with structure database 102 and application engine 104 via a local area network. It will, however, be clear to those skilled in the art, after reading this disclosure, how to make and use alternative embodiments of the present invention in which data simplification system 103 communicates with one or more of the entities depicted in FIG. 1 via a different network. The network can be, for example, the Internet, the Public Switched Telephone Network (PSTN), a wide area network, and so on.

Application engine 104 is responsible for the modeling, or for a different type of processing, that uses the simplified environment data received from system 103, and the presentation of the modeling results, in accordance with the illustrative embodiment. As depicted, engine 104 executes on a data-processing system that comprises hardware and software. In some alternative embodiments, application engine 104 can be realized in the form of software and/or hardware within data simplification system 103 itself (e.g., within data-processing system 201 described below, etc.).

Figure 2:
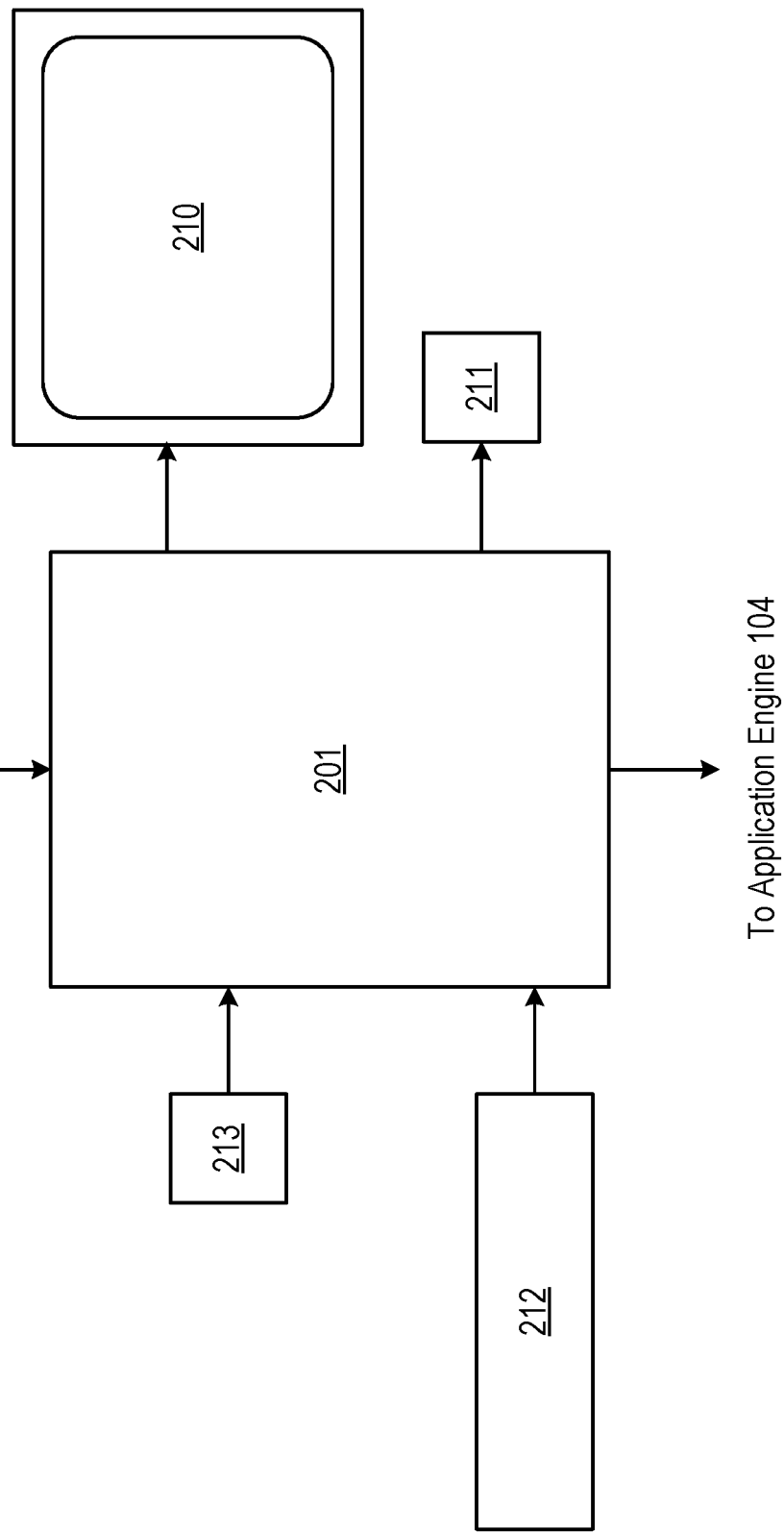
FIG. 2 depicts a block diagram of the salient components of data simplification system 103, within data creation and simplification system 100.

FIG. 2 depicts a block diagram of the salient components of data simplification system 103, in accordance with the illustrative embodiment. Data simplification system 103 comprises: data-processing system 201, video display 210, speaker 211, keyboard 212, and pointing device 213, interconnected as shown.

Data-processing system 201 is a general-purpose computer that comprises a processor, memory, and input and output interfaces for a user interface. Data-processing system 201 is capable of performing the tasks described below. Data-processing system 201:

i. receives one or more datasets from structure database 102, and
iii. receives a keyboard signal from keyboard 212, comprising a user input control, and
iii. receives a pointing and command signal from pointing device 213, comprising a user input control, and
iv outputs a video signal to video display 210 to present displayable objects, such as those representing simplified data including structures, and
v. outputs a speaker signal to speaker 211.

Figure 3:
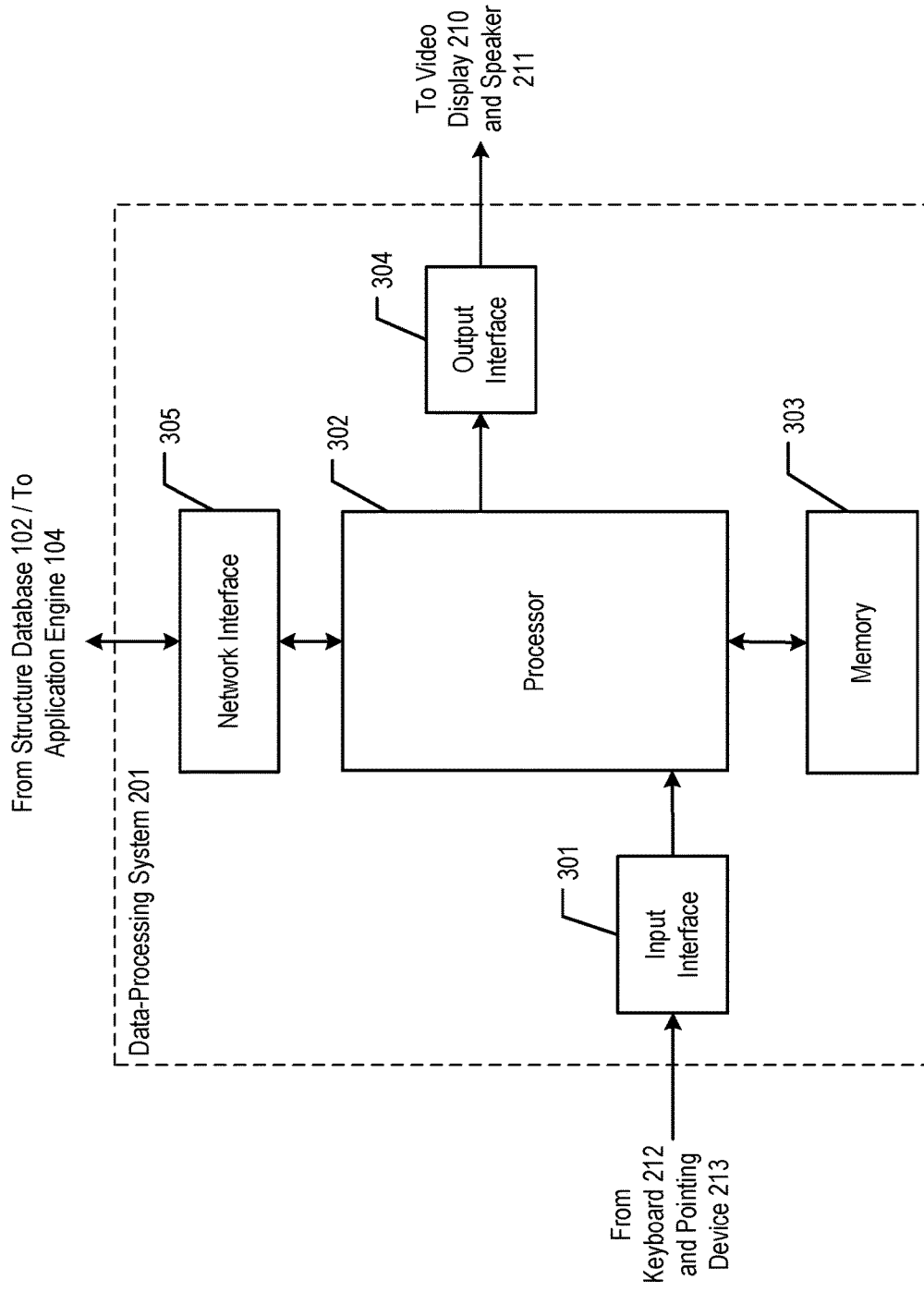
FIG. 3 depicts a block diagram of the salient components of data-processing system 201, within data simplification system 103.

Data-processing system 201 is further depicted in FIG. 3.

Video display 210 is a display device (e.g., a monitor, etc.) as is well known in the art that receives a video signal and creates a visual image of the signal for presentation to a user. In accordance with the illustrative embodiment, display 210 receives the signals that are generated as described below and presents visual images of the simplified data and, in some embodiments of the present invention, modeling results based on the simplified data. It will be clear to those skilled in the art, after reading this specification, how to make and use video display 210.

Speaker 211 is an electro-acoustic transducer as is well known in the art that receives a speaker signal and creates an audible sound of the signal for a user. It will be clear to those skilled in the art, after reading this specification, how to make and use speaker 211.

Keyboard 212 is a character input device as is well known in the art that receives input from a user and transmits keyboard signals representing that input. It will be clear to those skilled in the art, after reading this specification, how to make and use keyboard 212.

Pointing device 213 is a spatial input device (e.g., a mouse, a joystick, a touchpad, a stylus, etc.) as is well known in the art that receives spatial and command (e.g., button, wheel, etc.) input from a user and that transmits pointing and command signals representing that input. It will be clear to those skilled in the art, after reading this specification, how to make and use pointing device 213.

In accordance with the illustrative embodiment, data simplification system 103 performs at least some of the tasks described below. As those who are skilled in the art will appreciate after reading this specification, however, a different system can perform some or all of said tasks.

FIG. 3 depicts a block diagram of the salient components of data-processing system 201, in accordance with the illustrative embodiment. Data-processing system 201 is a computing device and comprises input interface 301, processor 302, memory 303, output interface 304, and network interface 305 interconnected as shown. In accordance with the illustrative embodiment, data-processing system 201 is a personal computer.

Input interface 301 receives signals from keyboard 212 and pointing device 213, and forwards the information encoded in the signals to processor 302. It will be clear to those skilled in the art, after reading this specification, how to make and use input interface 301.

Processor 302 is a general-purpose processor that is capable of: receiving information from input interface 301; reading data from and writing data into memory 303; executing at least some of the tasks described below; and transmitting information to output interface 304. In some alternative embodiments of the present invention, processor 302 might be or might comprise a special-purpose processor, such as a graphics-processing unit (GPU). In either case, it will be clear to those skilled in the art, after reading this specification, how to make and use processor 302.

Memory 303 stores data and executable instructions, is a combination of volatile and non-volatile memory, and is non-transitory. It will be clear to those skilled in the art, after reading this specification, how to make and use memory 303.

Output interface 304 receives information from processor 302, and outputs signals that encode this information to video display 210 and speaker 211. In some embodiments, output interface 304 can be built into a video card, which can be used to offload at least some of the processing from processor 302. It will be clear to those skilled in the art, after reading this specification, how to make and use output interface 304.

Network interface 305 receives one or more datasets from structure database 102. In some alternative embodiments of the present invention, the datasets are made available to data-processing system 201 through other means. It will be clear to those skilled in the art, after reading this specification, how to make and use network interface 305.

As those who are skilled in the art will appreciate after reading this specification, the hardware platform performing at least some of the tasks performed by data-processing system 201 can be embodied as a multi-processor platform, as a sub-component of a larger computing platform, as a virtual computing element, or in some other computing environment—all within the scope of the present invention. The steps described herein can be performed in a single processor, or distributed across multiple processors. Furthermore, data-processing system 201 can be a type of apparatus different than a personal computer, such as a server computer, and can be referred to by a different name such as a computer system, a computing device, or another type of hardware platform that comprises one or more processors, one or more memories, and one or more network interfaces, for example and without limitation.

Figure 4:
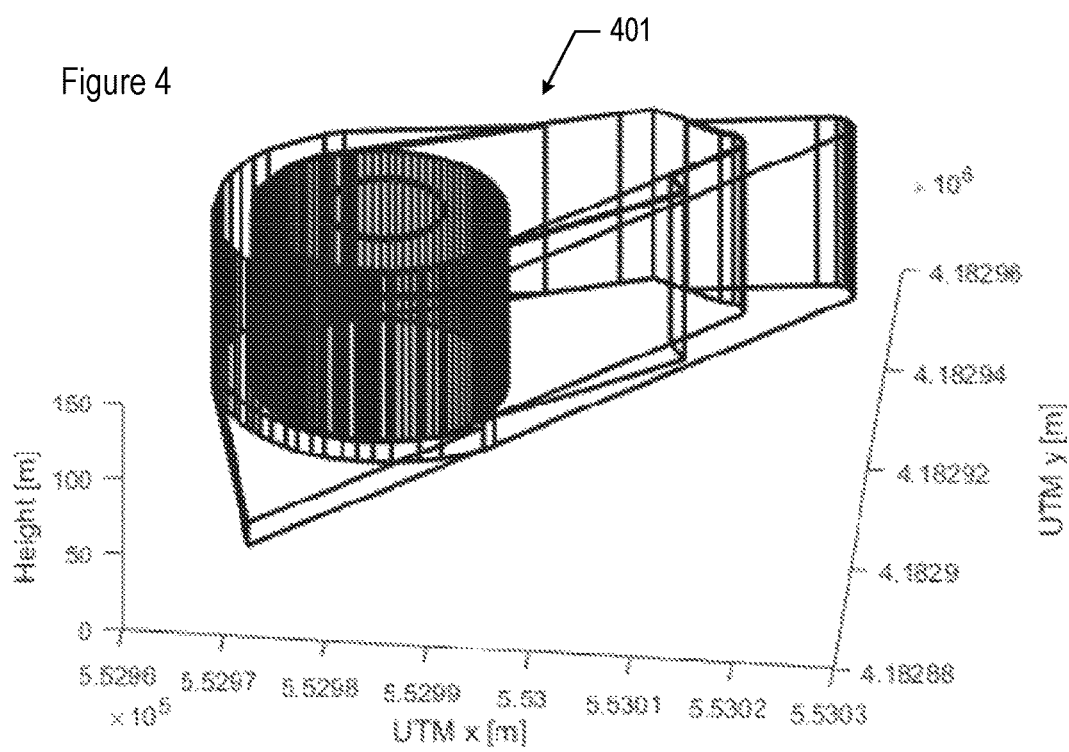
FIG. 4 depicts structure dataset 401, which comprises data in the form of polyhedrons.

FIG. 4 depicts structure dataset 401, which comprises data in the form of polyhedrons, which in this example represent a building. The represented building is that which is located at 388 Market Street in San Francisco, Calif., United States of America. This particular building is featured in this specification for pedagogical purposes, as it is a departure from a conventional, boxy building. As those who are skilled in the art will appreciate after reading this specification, however, structure data for any building or buildings can be accommodated by the system disclosed herein.

Figure 5:
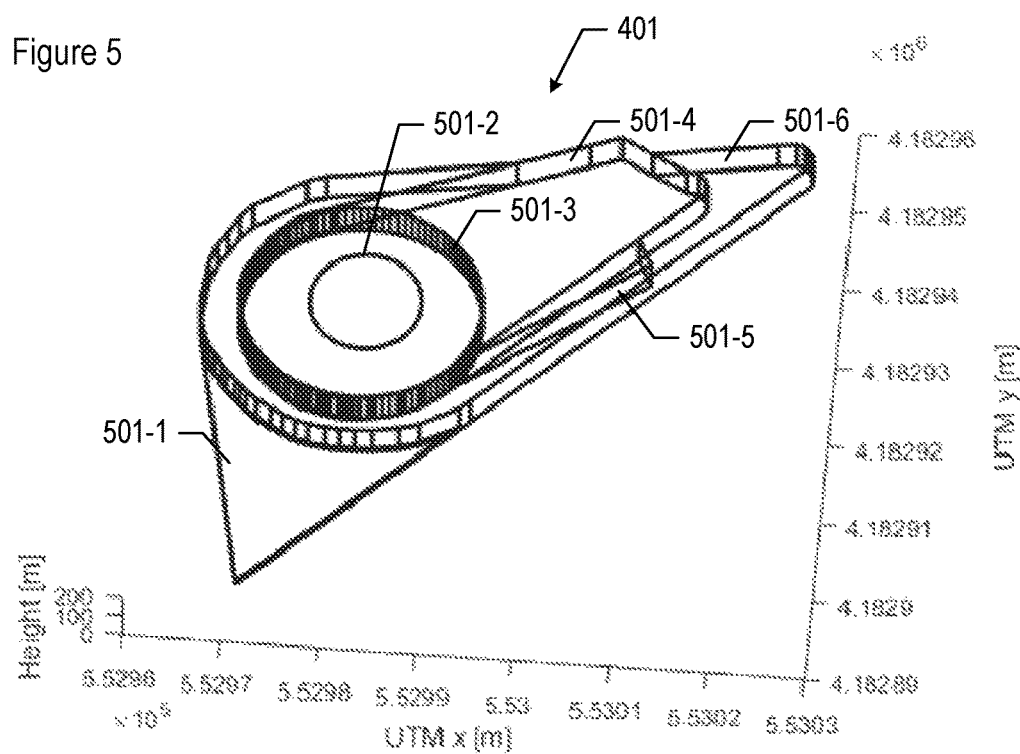
FIG. 5 depicts the polyhedrons that make up structure dataset 401.

Structure dataset 401 is made up of six polyhedrons, which can more clearly be seen in FIG. 5: they are polyhedrons 501-1 through 501-6. Each polyhedron can be represented in the dataset, specified in the form of i) a series of vertices that define a polygon footprint of the polyhedron (i.e., along the x-axis and y-axis) and ii) a height (i.e., along the z-axis). Most of the polyhedrons are situated next to at least one other polyhedron, such as polyhedrons 501-1 and 501-6 next to each other, while polyhedron 501-2 is stacked on top of polyhedron 501-3. Polyhedrons 501-1 through 501-6 are specified using six polygon footprints, or one for each polyhedron, with a total of 486 vertices. The 486 vertices are used to define the 486 vertical walls and six roofs that make up the six polyhedrons.

As described above, each polyhedron is defined in part as having a polygon footprint. As those who are skilled in the art will appreciate after reading this specification, however, footprints of at least some other types of plane figures (e.g., circles, etc.) that correspond to least some other types of geometric solids different than polyhedrons can be handled by at least some of the techniques disclosed herein. Moreover, such footprints can be defined in dataset 401 by features other than vertices, as those who are skilled in the art will appreciate after reading this specification; for example, a circle can be defined by its center point and radius.

In accordance with the illustrative embodiment, the two vertices in the lower corners of the wall and a height component define a vertical wall of a polyhedron. As those who are skilled in the art will appreciate after reading this specification, however, the two vertices in the upper corners can be used along with a height component.

Figure 6:
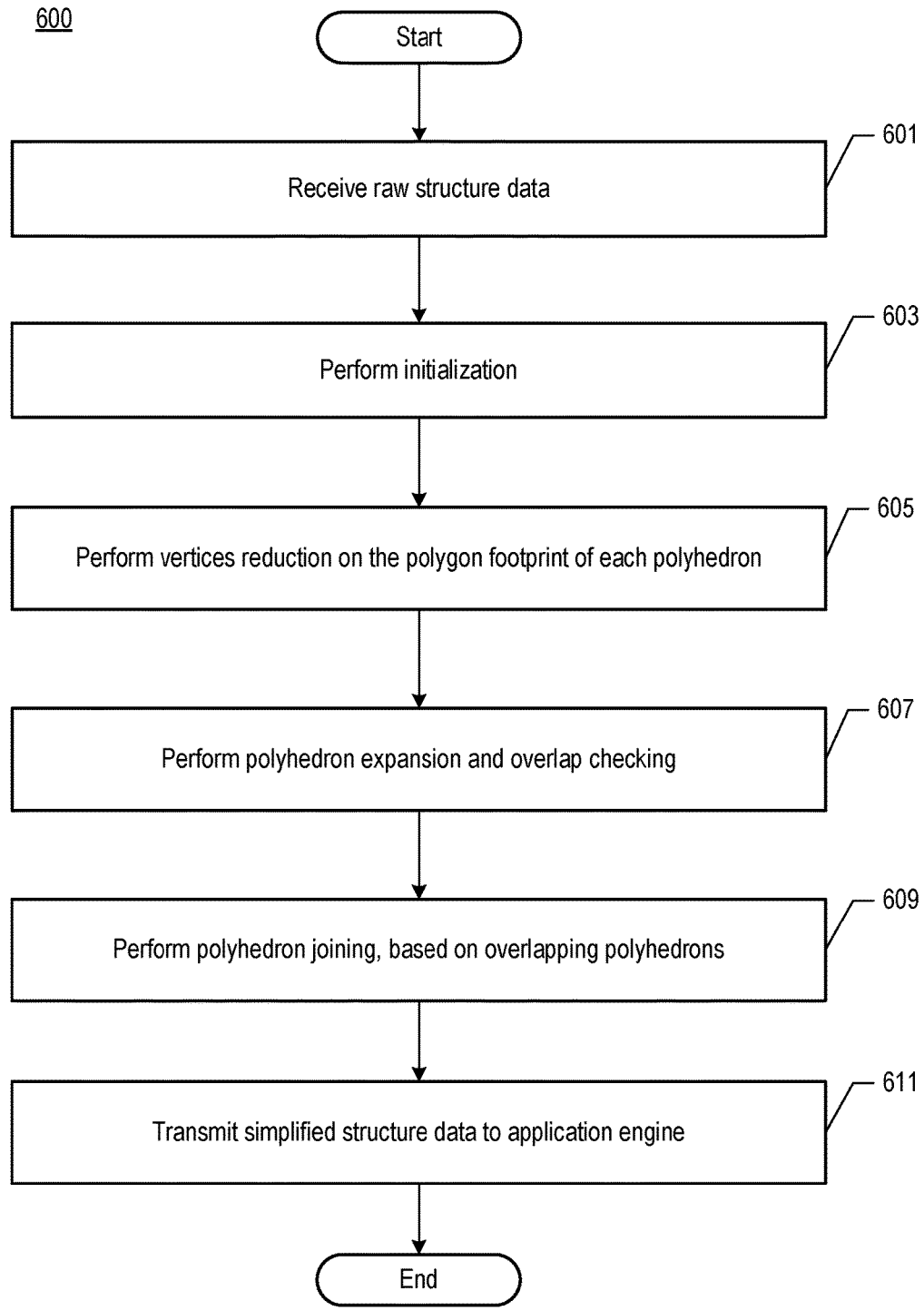
FIG. 6 depicts a flowchart of the salient processes of method 600, performed in accordance with the illustrative embodiment.

FIG. 6 depicts a flowchart of the salient processes of method 600, performed in accordance with the illustrative embodiment and comprising operations that are depicted in a particular order. It will be clear to those having ordinary skill in the art, after reading the present disclosure, how to make and use alternative embodiments of method 600, as well as the other methods disclosed in this specification, wherein the recited operations sub-operations, and messages are differently sequenced, grouped, or sub-divided—all within the scope of the present disclosure. It will be further clear to those skilled in the art, after reading the present disclosure, how to make and use alternative embodiments of the disclosed methods wherein some of the described operations, sub-operations, and messages are optional, are omitted, or are performed by other elements and/or systems.

The structure simplification techniques disclosed in FIG. 6 and related figures are depicted as being performed by data-processing system 201 within data simplification system 103. As those who are skilled in the art will appreciate after reading this specification, however, these disclosed techniques can be performed elsewhere.

At task 601, data-processing system 201 receives raw (i.e., non-simplified) structure data from structure database 102. In particular, system 201 receives dataset 401 that is representative of a structure or structures defined by one or more polyhedrons, each of which having a footprint defined by a polygon (i.e., a "polygon footprint"). Each polygon, in turn is made up of vertices and edges. In some embodiments of the present invention, the dataset is characterized as having a predetermined error. The predetermined error can be characterized in terms of a particular resolution in the data (e.g., 1 meter, 2 meters, 5 meters, 6 meters, 10 meters, 15 meters, 20 meters, 25 meters, 30 meters, etc.), a particular accuracy in terms of how each vertex point has been specified horizontally and/or vertically in relation to its true position, or something else.

At task 603, data-processing system 201 performs an initialization based on the data received at task 601. Task 603 is described below in regard to FIG. 7.

At task 605, data-processing system 201 performs vertices reduction on the polygon footprint of each polyhedron in the initialized data. The performing of task 605 can result in the removal of one or more vertices from one or more polygon footprints. Task 605 is described below and in regard to FIG. 8.

At task 607, data-processing system 201 performs polyhedron expansion and overlap checking. Task 607 is described below and in regard to FIG. 15.

At task 609, data-processing system 201 performs polyhedron joining, based on the polyhedrons that are found to be overlapping at task 607. Task 609 is described below and in regard to FIG. 19.

At task 611, data-processing system 201 transmits, to application engine 104, the environment data that has been simplified in accordance with one or more of the aforementioned tasks. In some embodiments of the present invention, system 201 "transmits" the data by making it available to a software process used to implement the processing associated with application engine 104. The processing associated with application engine 104 is described below and in regard to FIG. 23.

Figure 7:
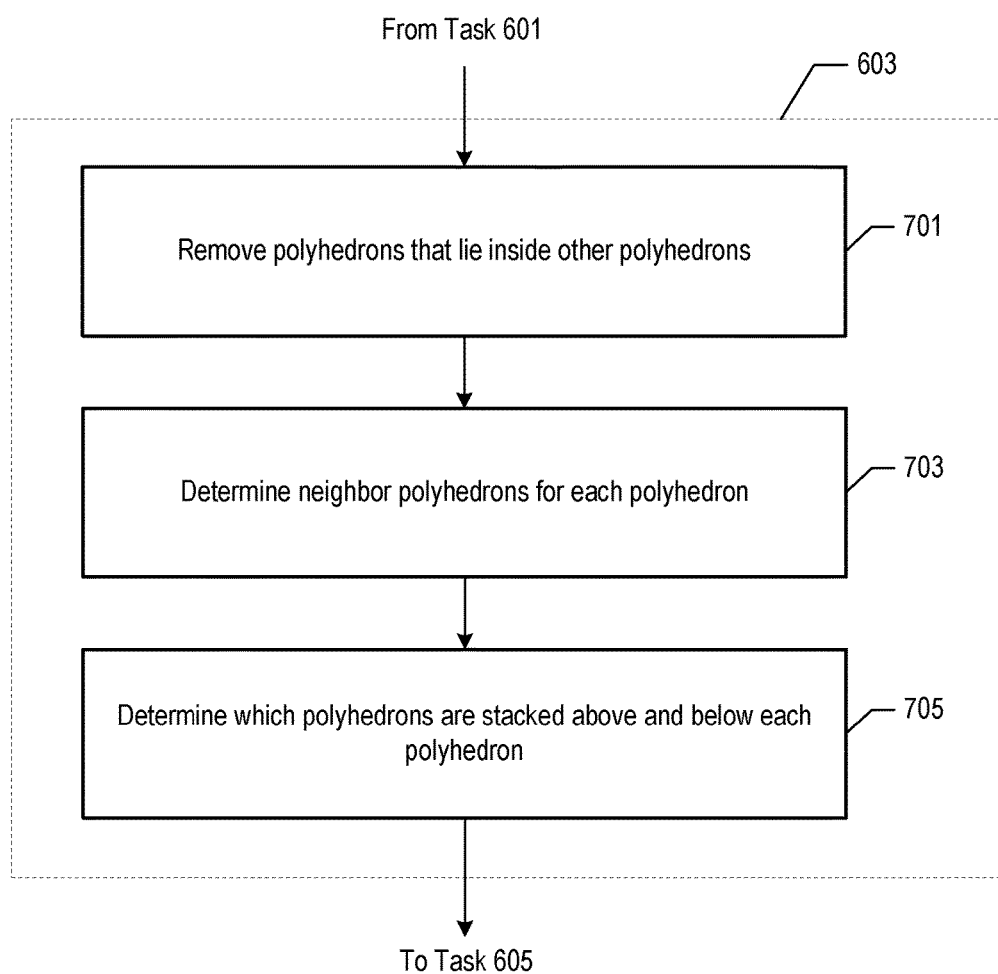
FIG. 7 depicts a flowchart of the salient processes of task 603 related to performing initialization, as part of method 600.

FIG. 7 depicts a flowchart of the salient processes of task 603 related to performing initialization, in accordance with the illustrative embodiment. At task 701, data-processing system 201 removes polyhedrons that are situated inside of other polyhedrons represented in structure dataset 401. In accordance with the illustrative embodiment, system 201 removes polyhedrons that are completely inside other polyhedrons. In some alternative embodiments of the present invention, system 201 removes polyhedrons that are only partially inside; for example, a predetermined percentage a first polyhedron might be inside a second polyhedron, so the first polyhedron is removed, wherein the percentage might be based on the predetermined error of the dataset, or on a wavelength in a wave propagation being modeled, or on a different characteristic.

System 201 can use a polygon clipping algorithm in order to first determine whether the footprints overlap, and by how much, and then can compare the heights of polyhedrons to determine overlap along the z-axis (i.e. vertically).

At task 703, system 201 determines which polyhedrons are neighbors to each polyhedron in dataset 401 (i.e., within a predetermined distance), for all of the remaining polyhedrons. Some polyhedrons can have one or more neighbor polyhedrons, while some polyhedrons might be isolated and not have any neighbor polyhedrons. Neighbor polygons are processed in accordance with tasks 705 and 1903, as described below.

System 201 can use a distance check, as is known in the art, to determine the neighbor polyhedrons of a given polyhedron, for each polyhedron under consideration.

At task 705, system 201 determines which polyhedrons are stacked above and below each polyhedron. Knowing which polyhedrons are above or below another polyhedron can be used to determine which polyhedrons make up a given building or other type of structure. This is important in order to handle similar polyhedrons, or at least similarly situated polygons, in a coordinated manner, under certain conditions. System 201 can use a point-in-polygon algorithm (e.g., inpolygon, etc.), as is known in the art, over each polyhedron's neighbors.

Figure 8:
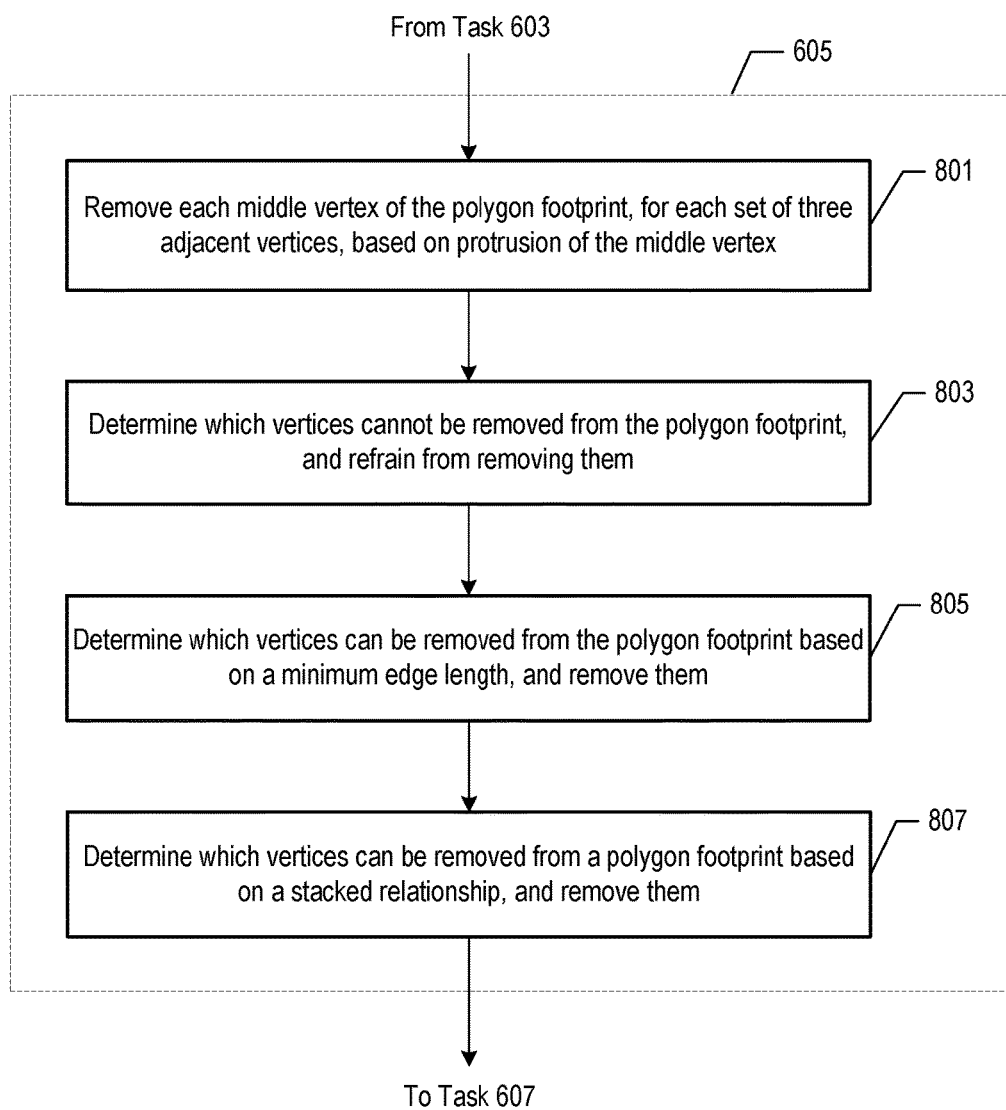
FIG. 8 depicts a flowchart of the salient processes of task 605 related to performing vertices reduction on the polygon footprint of each initialized polyhedron, as part of method 600.
Figure 9:
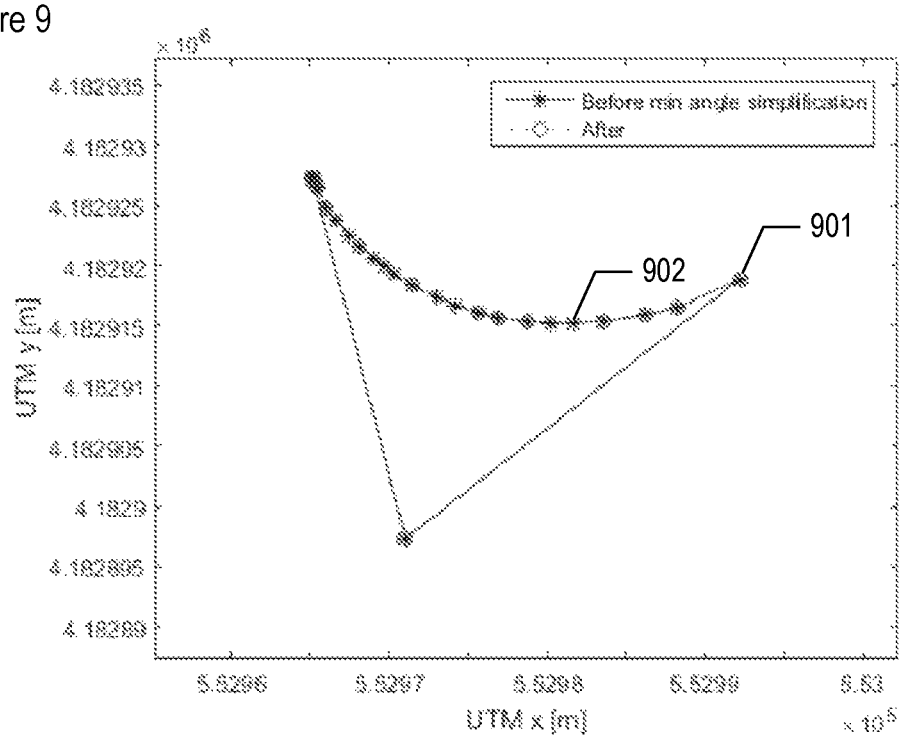
FIG. 9 depicts a first illustrative footprint, belonging to polyhedron 501-1.
Figure 10:
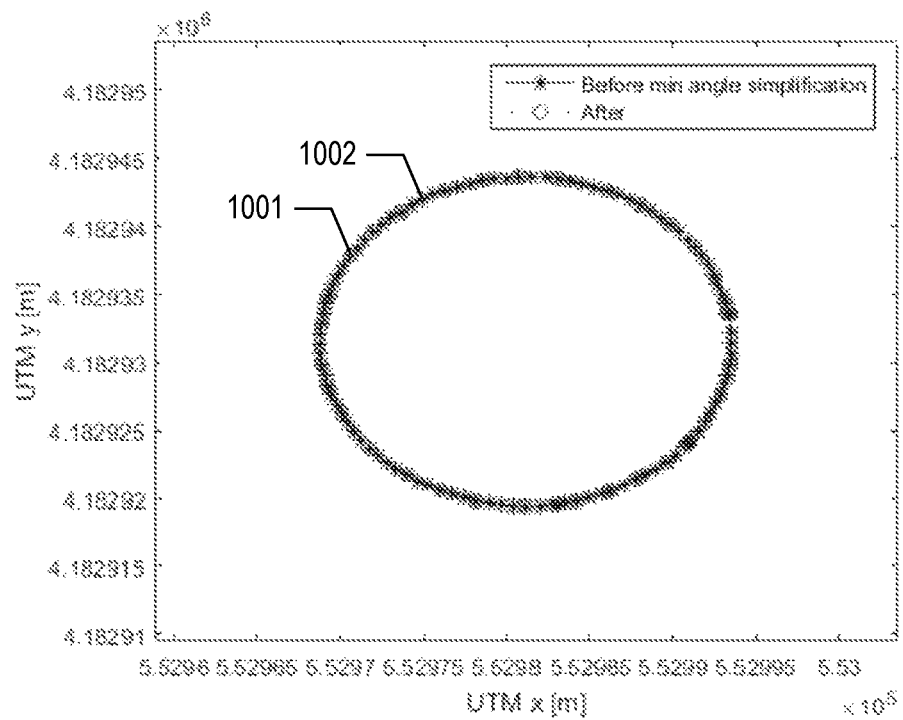
FIG. 10 depicts a second illustrative footprint, belonging to polyhedron 501-3.

FIG. 8 depicts a flowchart of the salient processes of task 605 related to performing vertices reduction on the polygon footprint of each initialized polyhedron, in accordance with the illustrative embodiment. At task 801, data-processing system 201 removes each middle vertex of each set of three adjacent vertices, on the condition that the middle vertex does not protrude by more than a predetermined amount. FIG. 9 depicts a first illustrative footprint, belonging to polyhedron 501-1, in which the performing of task 801 reduces the number of vertices from 23 to 14. In the example, vertex 901 remains after task 801 is performed, while vertex 902 can be removed. FIG. 10 depicts a second example, in which the number of vertices in a second illustrative footprint is reduced from 107 to 35 in accordance with task 801. In the example, vertex 1001 remains after task 801 is performed, while vertex 1002 can be removed. This second example is of polyhedron 501-3.

For reducing the number of vertices, system 201 can use a minimum angle algorithm for each set of three vertices, in order to determine how for the middle vertex protrudes. In other words, the angle between i) the edge formed by an outer and the middle vertex, in a trio of vertices, and ii) an imaginary line running passing through the two outer vertices in the trio does not exceed a predetermined amount. As those who are skilled in the art will appreciate, after reading this specification, other equivalent methods can be used in determining whether a middle vertex protrudes by less than a predetermined amount in relation to its adjacent vertices. These types of vertices can be removed because the overall region around the removed vertices is still smooth enough for use in the modeling to be performed.

At task 803, system 201 determines which vertices cannot be removed from the polygon footprint because they define a large vertical wall. In accordance with the illustrative embodiment, system 201 removes a vertex that defines (along with a second vertex) an edge of a polygon footprint, only if the edge does not exceed a predetermined first length; alternately, system 201 identifies a vertices as being non-removable if the edge does exceed the predetermined first length.

Figure 11:
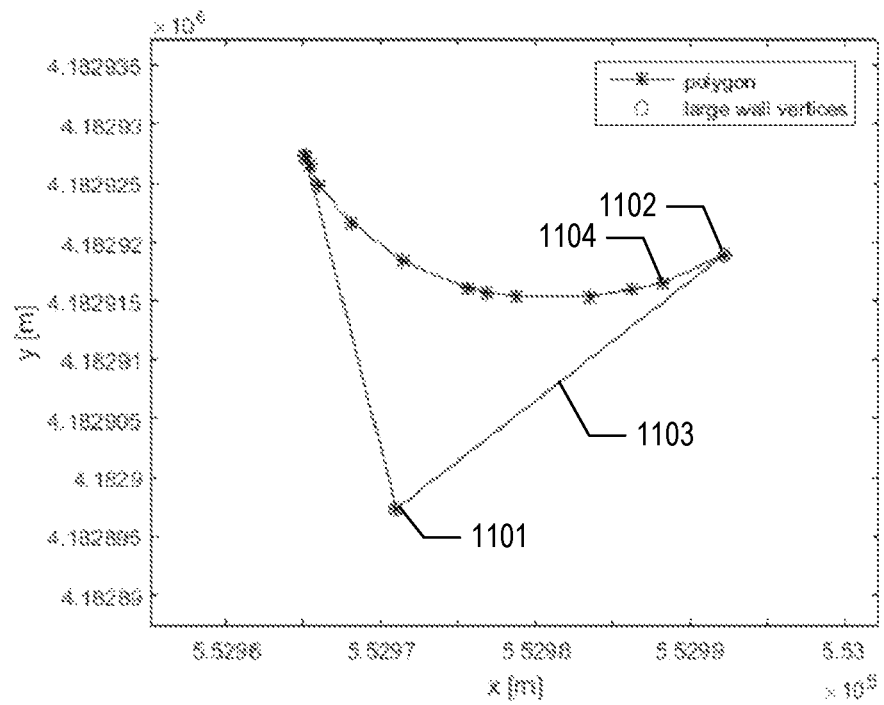
FIG. 11 depicts the first illustrative footprint, in which the performing of task 803 results in two large vertical walls being identified.

FIG. 11 depicts the first illustrative footprint, (i.e., belonging to polyhedron 501-1), in which the performing of task 803 results in two large vertical walls being identified and, as a result, whose defining vertices are marked as being non-removable. In the example, vertices 1101 and 1102 are identified as defining edge 1103 (i.e., associated with a large wall) and, as such, are marked as being non-removable; in contrast, vertex 1104 (and at least some of the other vertices) can be removed.

Figure 12:
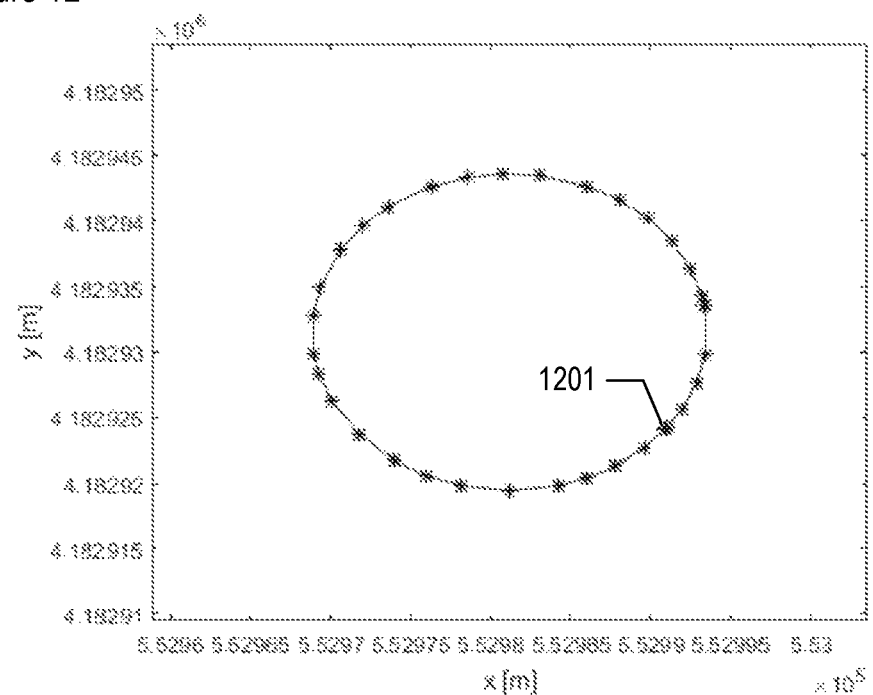
FIG. 12 depicts the second illustrative footprint, in which no large walls are identified, so no vertices are marked as being non-removable.

FIG. 12 depicts the second example, in which no large walls are identified, so no vertices are marked as being non-removable. The one vertex that is "marked" in the figure, vertex 1201, is the starting vertex that is used when listing the vertices.

In some embodiments of the present invention, system 201 can select the predetermined first length based on a first orientation of an edge that is created by removing a reference vertex, in relation to a second orientation of an edge that is defined in part by the reference vertex. The first orientation in relation to the second orientation can be characterized as exhibiting a maximum rotation.

In some embodiments of the present invention, system 201 can identify a vertex as non-removable because it co-defines a large vertical wall, based on one or more of:
  i. the length of the edge defined by the vertex, as already discussed,
  ii. the wavelength (e.g., average, highest, lowest, etc.) of the electromagnetic propagation to be modeled,
  iii. the resolution (or other error characteristic such as accuracy) of dataset 401,
  iv. the amount of processing resources (e.g., processor speed, memory, etc.) available to system 201, and
  v. the height of the wall that is also defined by the vertex being considered.

At task 805, system 201 determines which vertices can be removed based on an edge not exceeding a predetermined second length, wherein the predetermined second length is shorter than the predetermined first length used in accordance with task 803, and provided that the vertex under consideration has not already been identified as being non-removable. In accordance with the illustrative embodiment, task 805 is performed after task 803 so that, for example, a particular vertex that co-defines a first edge that exceeds the predetermined first length is not removed if the vertex also co-defines a second edge that is shorter than the predetermined second length.

In order to perform task 805, in some embodiments of the present invention system 201 can select a first control vertex of the polygon footprint being considered, and than assess each successive vertex of the polygon along a fixed direction, such that for each successive vertex being assessed, the system removes the vertex if it is within the predetermined second length from the first control vertex, unless the vertex was already identified as being non-removable. Then, when a vertex is encountered that is not removed, system 201 can make that vertex the next control vertex, assess each successive vertex in relation to that next control vertex, an so on, until system 201 arrives at the end of the polygon footprint currently under consideration.

Figure 13:
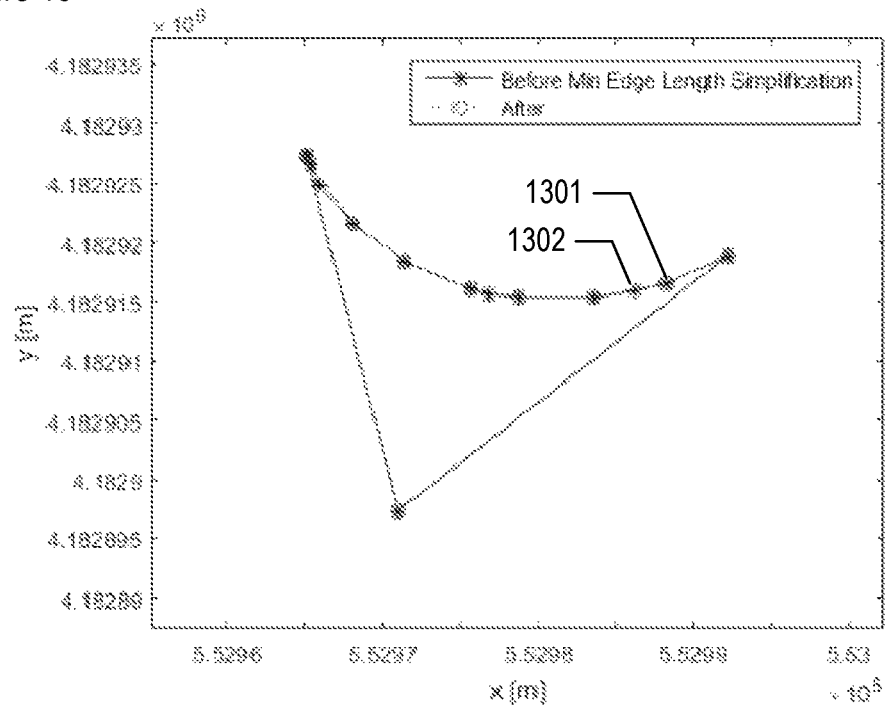
FIG. 13 depicts the first illustrative footprint, in which the performing of task 805 reduces the number of vertices.

FIG. 13 depicts the first illustrative footprint, in which the performing of task 805 reduces the number of vertices from 14 to 9. In the example, vertex 1301 remains after task 805 is performed, while vertex 1302 can be removed.

Figure 14:
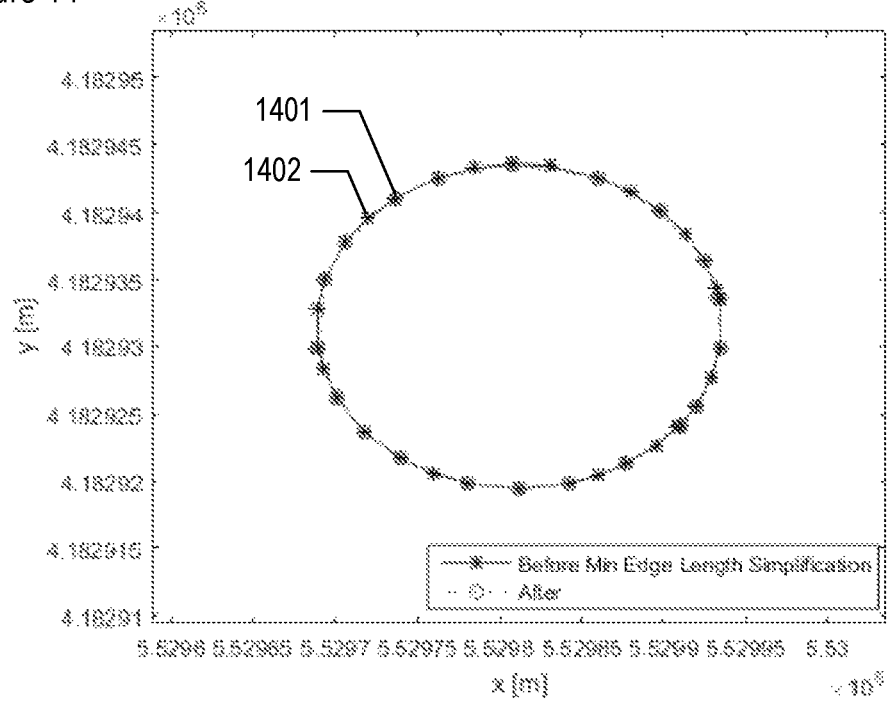
FIG. 14 depicts the second illustrative footprint, in which the performing of task 805 reduces the number of vertices.

FIG. 14 depicts the second example, in which the number of vertices is reduced from 35 to 20 in accordance with task 805. In the example, vertex 1401 remains after task 805 is performed, while vertex 1402 can be removed.

At task 807, system 201 considers each polyhedron that is vertically stacked with regard to each reference polyhedron, as determined at task 705, and removes one or more vertices from a vertically stacked polyhedron based on how one or more vertices were removed from the polygon footprint of the reference polyhedron. In some embodiments of the present invention, only vertices from polygons belonging to vertically adjacent polyhedrons are removed in this way.

A beneficial effect this step can be to ensure consistency in terms of how similar polyhedrons, stacked on top of one another, are handled with respect to one other. As an example, two polyhedrons are stacked on top of each other in the dataset. For simplicity, the polyhedrons in this example have same shape, so that their vertical walls are contiguous. A difference between the two polyhedrons is that the vertices are specified in the dataset as clockwise for the first polyhedron and counterclockwise for the second polyhedron. If vertices reduction were to be performed independently on each of the two polyhedrons, system 201 might remove different vertices in each polyhedron, consequently creating an overhang of the upper polyhedron over the bottom one. Although one solution to this might be to ensure that vertices for each polygon are always specified clockwise, or always specified counterclockwise, this is not always possible or convenient. In contrast, performing vertices reduction on one of the polyhedrons, and then applying it to the other, can result in a consistent treatment of both polyhedrons.

Figure 15:
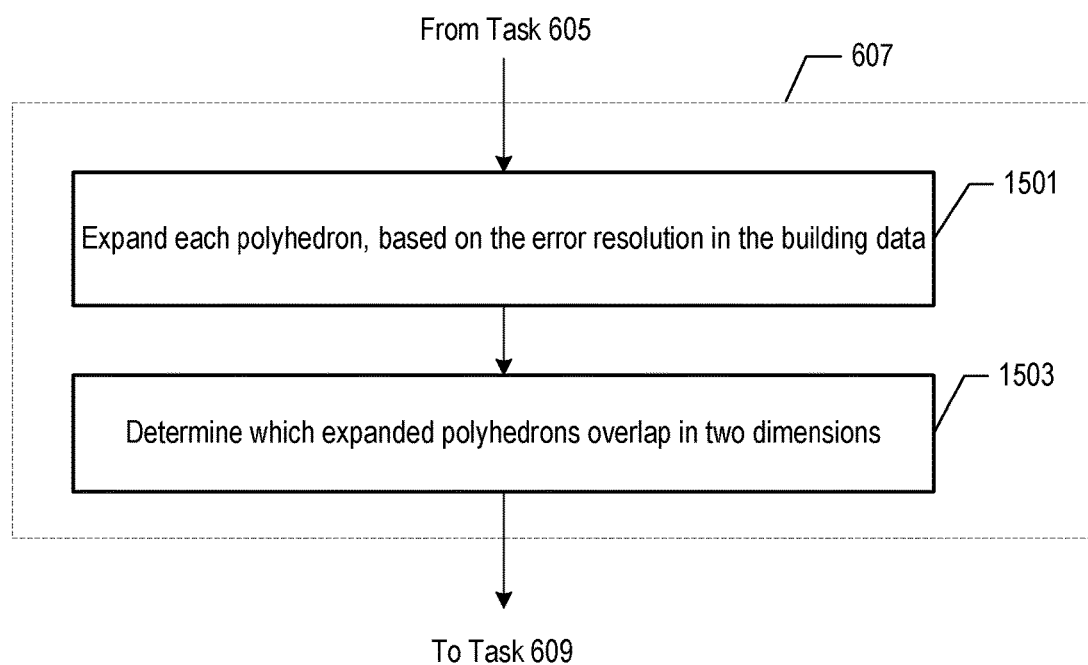
FIG. 15 depicts a flowchart of the salient processes of task 607 related to performing polygon expansion and overlap checking on the polygon footprints of each vertices-reduced polyhedron.

FIG. 15 depicts a flowchart of the salient processes of task 607 related to performing polygon expansion and overlap checking on the polygon footprints of each vertices-reduced polyhedron, in accordance with the illustrative embodiment. At task 1501, data-processing system 201 expands each polyhedron by expanding its polygon footprint. In accordance with the illustrative embodiment, system 201 expands the footprint by a factor that is based on the predetermined error of dataset 401. In some embodiments of the present invention, system 201 can expand the polygon footprint based on one or more characteristics other than or in addition to the dataset's predetermined error, such as the wavelength (e.g., average, highest, lowest, etc.) of an electromagnetic wave to be modeled as described below and in FIG. 23.

In some embodiments of the present invention, the factor by which the polygon footprint is expanded, or moved outward as discussed below, does not exceed a particular amount, the amount being determined by the predetermined error of dataset 401 and/or wavelength of the electromagnetic wave to be modeled. For example, the expansion that is done is less than the resolution of the dataset being used.

Figure 16:
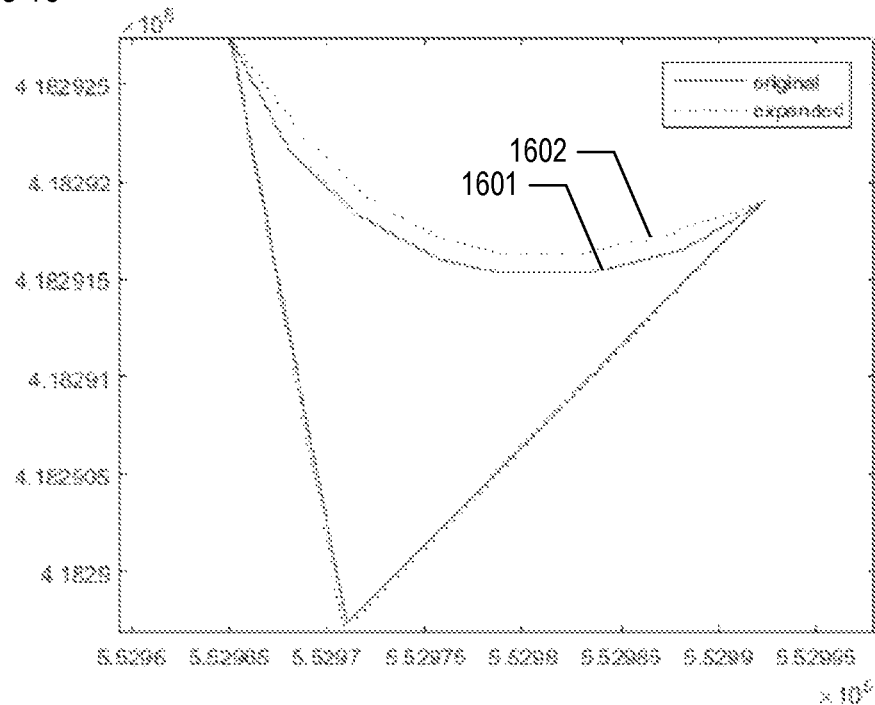
FIG. 16 depicts first illustrative footprint 1601, associated with polyhedron 501-1, and expanded footprint 1602.
Figure 17:
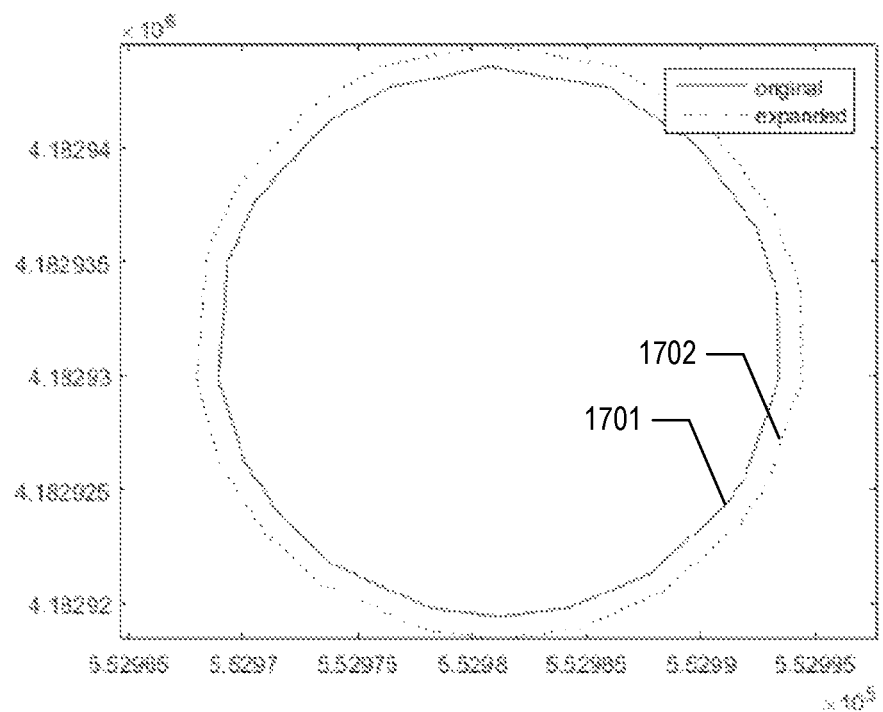
FIG. 17 depicts second illustrative footprint 1701, associated with polyhedron 501-3, and expanded to footprint 1702.

System 201 can expand a polygon footprint in part by moving the vertices based on the vector sum (e.g., normalized vector sum, non-normalized vector sum, etc.) of their adjacent edges' outward normals. A different way of putting this is moving each vertex in the sum direction of the outward normal of the vertex's adjacent edges. FIG. 16 depicts the first illustrative footprint 1601, belonging to polyhedron 501-1, in which the performing of task 1501 results in expanded footprint 1602 as shown. Note that the two edges that are adjacent to the bottom vertex do not visually appear to move in the direction of their outward normal. The reason is because the three vertices that are adjacent to these two edges are the center vertices of three acute angles, which causes their directions of movement to be approximately in line with the adjacent edges. FIG. 17 depicts the second example from earlier, in which footprint 1701 is expanded to footprint 1702 as shown. The edges in FIG. 16 are moved outward by different displacements, while the edges in FIG. 17 are moved outward in a relatively uniform way. This is because the vertices and edges of footprint 1701 are approximately equally spaced and distributed around the outline of footprint 1701.

In some alternative embodiments of the present invention, system 201 can expand a polygon footprint in part by moving at least one edge of the polygon in the direction of the outward normal of the edge itself, based on one or more of the factors described above. In some of these embodiments of the present invention, the amount by which an edge is moved outward can be inversely proportional to the length of the edge.

In some embodiments of the present invention, system 201 can expand some polygons, but not others, or can expand different polygons according to different factors such as different predetermined errors (e.g., error resolutions, etc.) that apply to different polygons. In some embodiments of the present invention, system 201 can expand one or more polyhedrons along their heights, in addition to or instead of along their footprints, such as for certain types of polyhedrons (e.g., non-prism, etc.) or if polyhedrons are to be "stacked" side by side instead of on top of each other, for example and without limitation.

In accordance with the illustrative embodiment, at least some of the vertices reduction performed in accordance with task 605 is performed prior to the polygon expansion of task 1501. The reason for this is to reduce the number of edges by reducing the number of vertices and, as a result, thereby reducing the number of edges that need to be moved outward, and thereby reducing the processing required.

Figure 18:
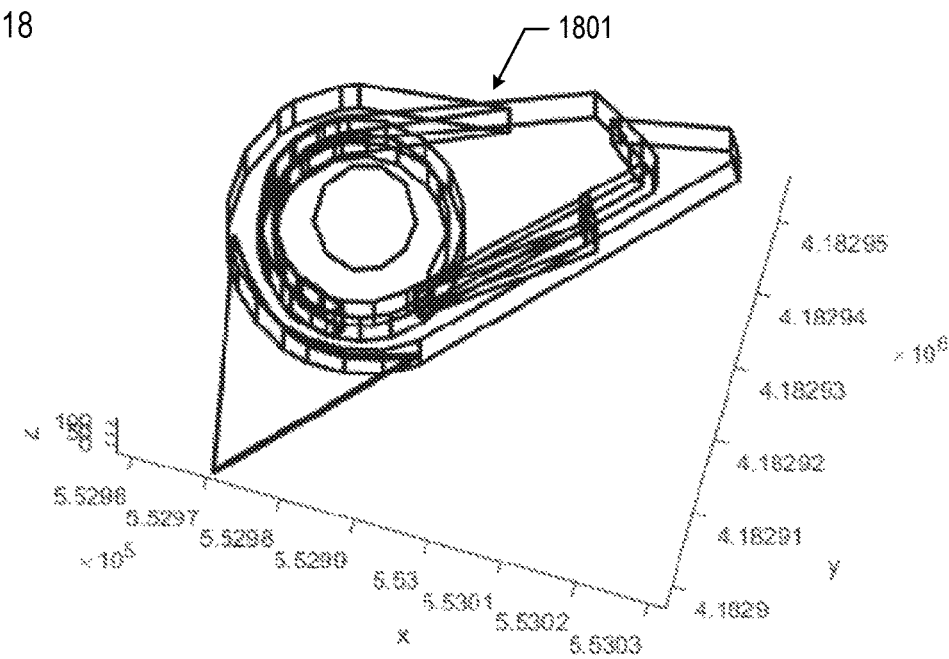
FIG. 18 depicts dataset 1801, created as the result of task 1501 being performed on all of the polyhedrons within the previous dataset.

FIG. 18 depicts dataset 1801, which is created as the result of task 1501 being performed on all of the polyhedrons within the previous dataset.

At task 1503, system 201 determines whether two or more expanded polygon footprints obtained in accordance with task 1501 overlap one another, thereby determining which expanded polyhedrons overlap across the x-axis and y-axis (i.e., in two dimensions along the ground). System 201 can make this determination by polygon clipping an expanded polygon footprint with the expanded polygon footprints of other, nearby polyhedrons. System 201 makes this determination in order to form a new polygon footprint based on overlapping, expanded footprints; the forming of new footprints, as part of polyhedron combining, is performed in accordance with task 609 discussed below.

Figure 20:
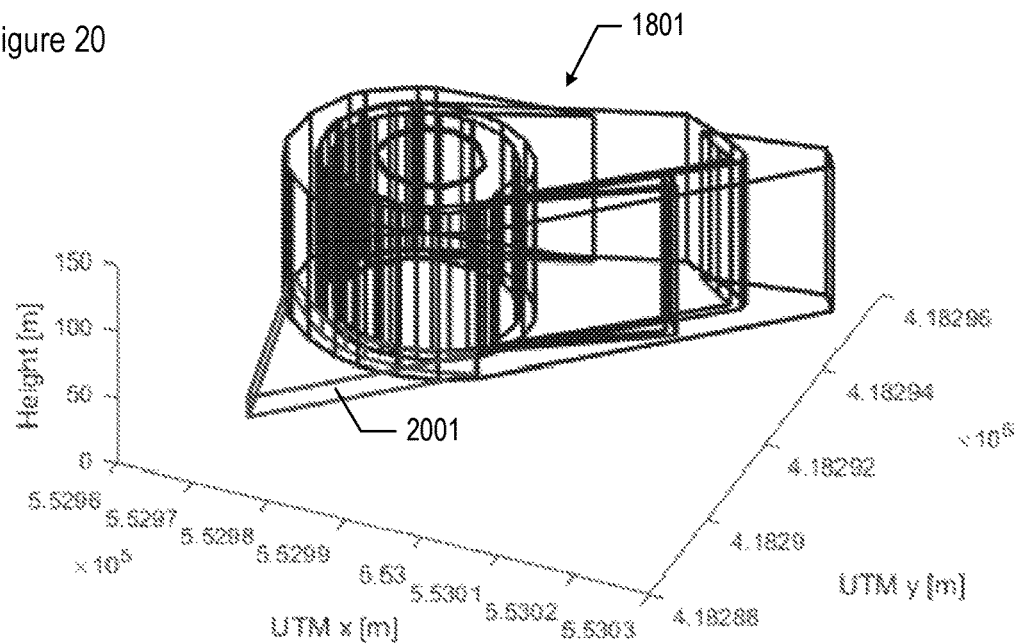
FIG. 20 depicts a different view of dataset 1801, in which polyhedron 2001 has been selected as the initial control polyhedron.
Figure 19:
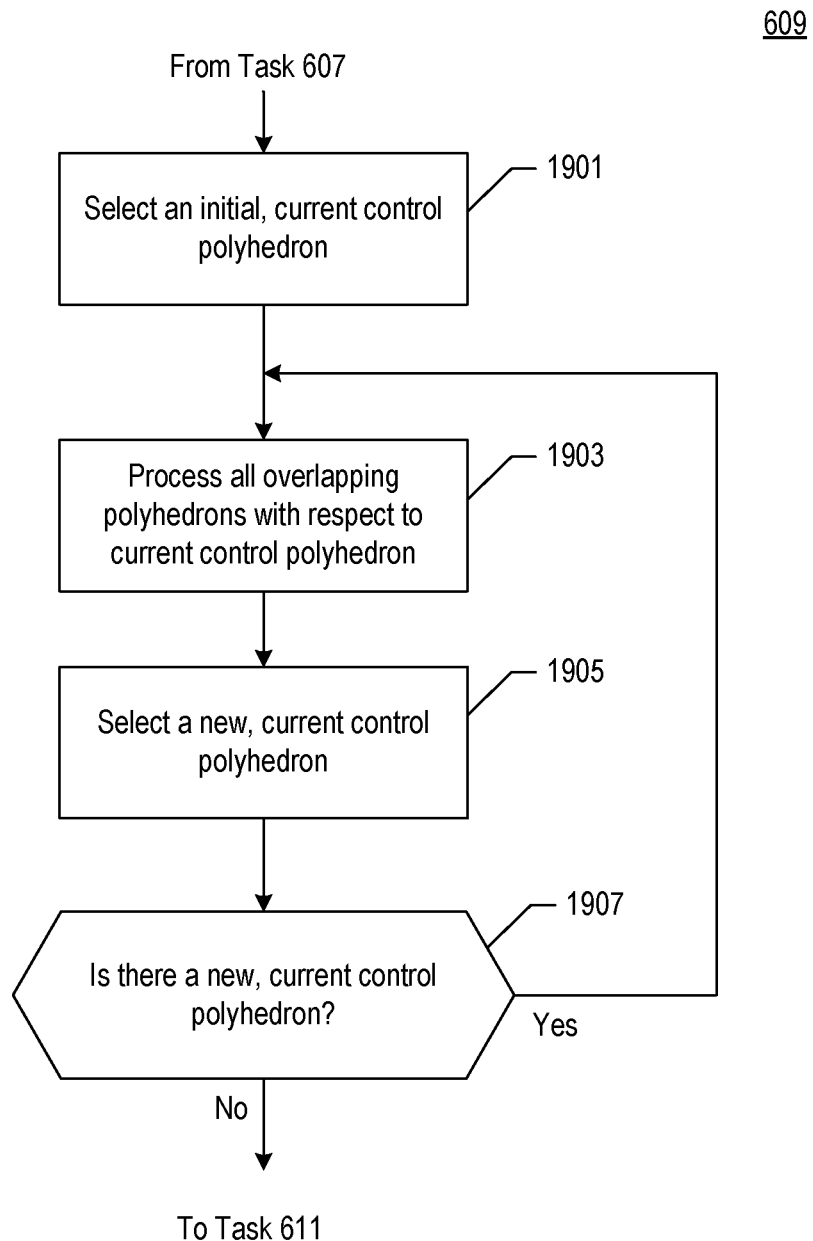
FIG. 19 depicts a flowchart of the salient processes of task 609 related to performing polyhedron joining on the expanded polyhedrons.

FIG. 19 depicts a flowchart of the salient processes of task 609 related to performing polyhedron joining on the expanded polyhedrons, in accordance with the illustrative embodiment. At task 1901, data-processing system 201 selects an initial control polyhedron having a control footprint. In accordance with the illustrative embodiment, the initial control polyhedron is selected based on at least one point of the polyhedron being characterized as having the lowest start elevation. The start elevation can be measured with respect to mean sea level, a local mean ground level, or some other reference. The actual point on the polyhedron whose start elevation is measured can be the lowest point on the polyhedron, the highest point on the polyhedron, an average of points on the polyhedron, or some other point. FIG. 20 depicts a different view of dataset 1801, in which the polyhedron 2001 has been selected as the initial control polyhedron.

At task 1903, system 201 processes all overlapping polyhedrons with respect to the current control polyhedron. Task 1903 is described below and with respect to FIG. 21.

At task 1905, system 201 selects a new control polyhedron based on a point on it being characterized as having the next lowest start elevation, compared with the previous control polyhedron.

As those who are skilled in the art will appreciate, after reading this specification, the technique depicted in FIG. 19 could start with selecting (at task 1901) a control polyhedron based on a point on it having the highest, rather than lowest, elevation; then the technique could process all overlapping polyhedrons (at task 1903); and then the technique could select (at task 1905) a new control polyhedron based on a point on it being characterized as having the next highest, rather than next lowest, start elevation, compared with the previous control polyhedron.

At task 1907, if there is a new control polyhedron, control of task execution proceeds to task 1903. Otherwise, control of task execution proceeds to task 611.

In some alternative embodiments of the present invention, data-processing system 201 can perform the depicted steps instead on non-expanded polyhedrons, based on determining whether polyhedrons are within a predetermined distance of each other (i.e., are "close enough" to each other) rather than determining whether they or their polygon footprints overlap. The distance can be based on the predetermined error of the dataset, or based on a wavelength of the electromagnetic wave propagation to be modeled, or both. The distance can vary from one polyhedron to another and from one edge to another within the same polygon footprint of a given polyhedron.

Figure 21:
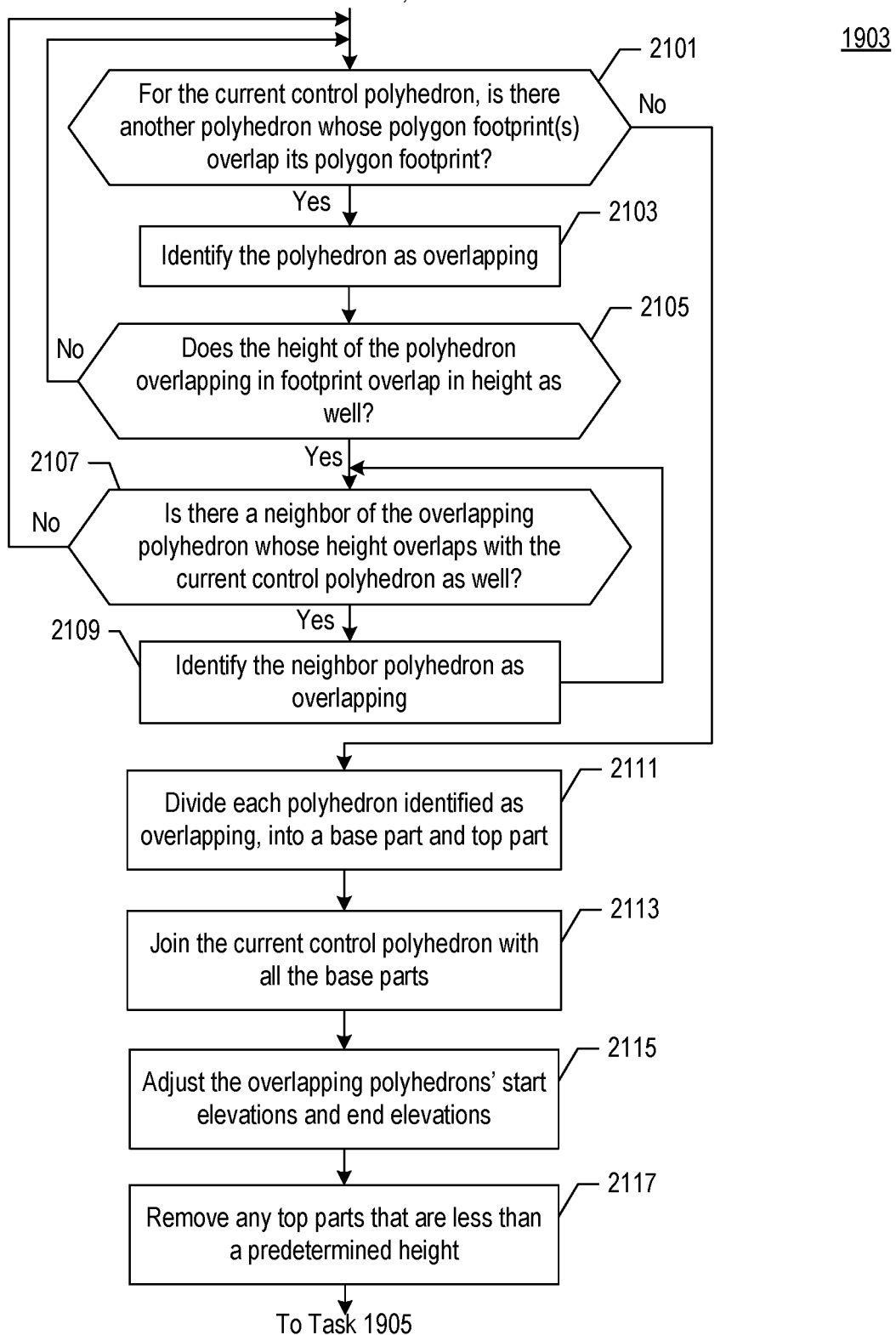
FIG. 21 depicts a flowchart of the salient processes of task 1903 related to performing processing for the current control polyhedron.

FIG. 21 depicts a flowchart of the salient processes of task 1903 related to performing processing for the current control polyhedron, in accordance with the illustrative embodiment. At task 2101, data-processing system 201 determines whether there is another polyhedron whose polygon footprint overlaps the footprint of the control polygon. If so, control of task execution proceeds to task 2103. If not, control of task execution proceeds to task 2111.

At task 2103, system 201 identifies the evaluated polyhedron as overlapping, adding it to a first non-empty set of polyhedrons whose polygon footprints overlap the control footprint.

At task 2105, system 201 determines whether the evaluated polyhedron's height also overlaps the height of the control polyhedron. If so, control of task execution proceeds to task 2107. If not, control of task execution proceeds to task 2101, in order to evaluate the next polyhedron with respect to the control polyhedron.

At task 2107, system 201 determines whether a neighbor of the overlapping polyhedron also overlaps in height with the control polyhedron. Neighbor polyhedrons were identified in accordance with task 703. If a neighbor also overlaps in height with the control polygon, control of task execution proceeds to task 2109. If not, control of task execution proceeds to task 2101, in order to evaluate the next polyhedron with respect to the control polyhedron.

At task 2109, system 201 identifies the evaluated neighbor polyhedron as overlapping, adding the neighbor to a second non-empty set of polyhedrons overlapping in height with the control polyhedron.

At task 2111, and when there are no new overlapping neighbor polyhedrons left to evaluate, system 201 divides each polyhedron in the second set of polyhedrons into a base part and a top part, resulting in a third set of polyhedrons. In accordance with the illustrative embodiment, the dividing is performed such that each base part has the same end elevation as the control polyhedron, and wherein each top part has a start elevation that is that same as the end elevation of the control polyhedron, wherein the end elevation of a given polyhedron is higher than the start elevation of the given polyhedron.

At task 2113, system 201 joins at least a portion of the control polyhedron with all of the base parts of the other polyhedrons in the third set of polyhedrons, resulting in a joined polyhedron. In accordance with the illustrative embodiment, parts of polyhedrons at the same level in elevation are joined together. In some alternative embodiments of the present invention, parts of polyhedrons at a level different from that coinciding with the base parts, are joined together.

At task 2115, system 201 adjusts the overlapping polyhedrons' start elevations and end elevations, among the top parts, in preparation for considering a next set of polyhedrons (i.e., made up of the former top parts) in the next iteration of task 1903. In other words, the start heights of these new polyhedrons coincide with the end height of the control polyhedron.

At task 2117, system 201 removes any polyhedron from the new set of polyhedrons created in task 2115 whose height is less than a predetermined value. In accordance with the illustrative embodiment, the predetermined height is based on the predetermined error of dataset 1801 (e.g., the resolution of the data, accuracy of the vertices relative to their true positions, etc.). Depending on the predetermined error, a polyhedron can be removed can be removed from the set created in task 2115 because whether it is present or not would not make any significant difference in the modeling performed in accordance with FIG. 23.

Figure 22:
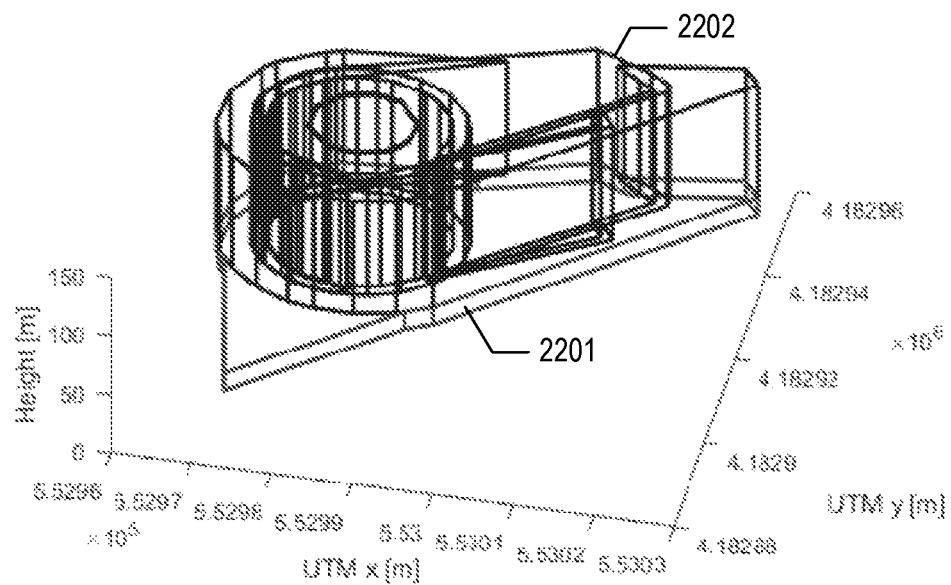
FIG. 22 depicts polyhedrons that were previously determined to be overlapping are now stacked on top of a single polyhedron that has been formed in part from the control polyhedron.

At this point, the polyhedrons that were previously determined to be overlapping are now stacked on top of the single polyhedron that has been formed from the control polyhedron and former base-part polyhedrons, as depicted in FIG. 22. Polyhedron 2201 was created as the result of the joining performed in accordance with task 2113, and one or more polyhedrons 2202 now make up the next set of polyhedrons to be analyzed for overlap, joining, and removal.

Figure 23:
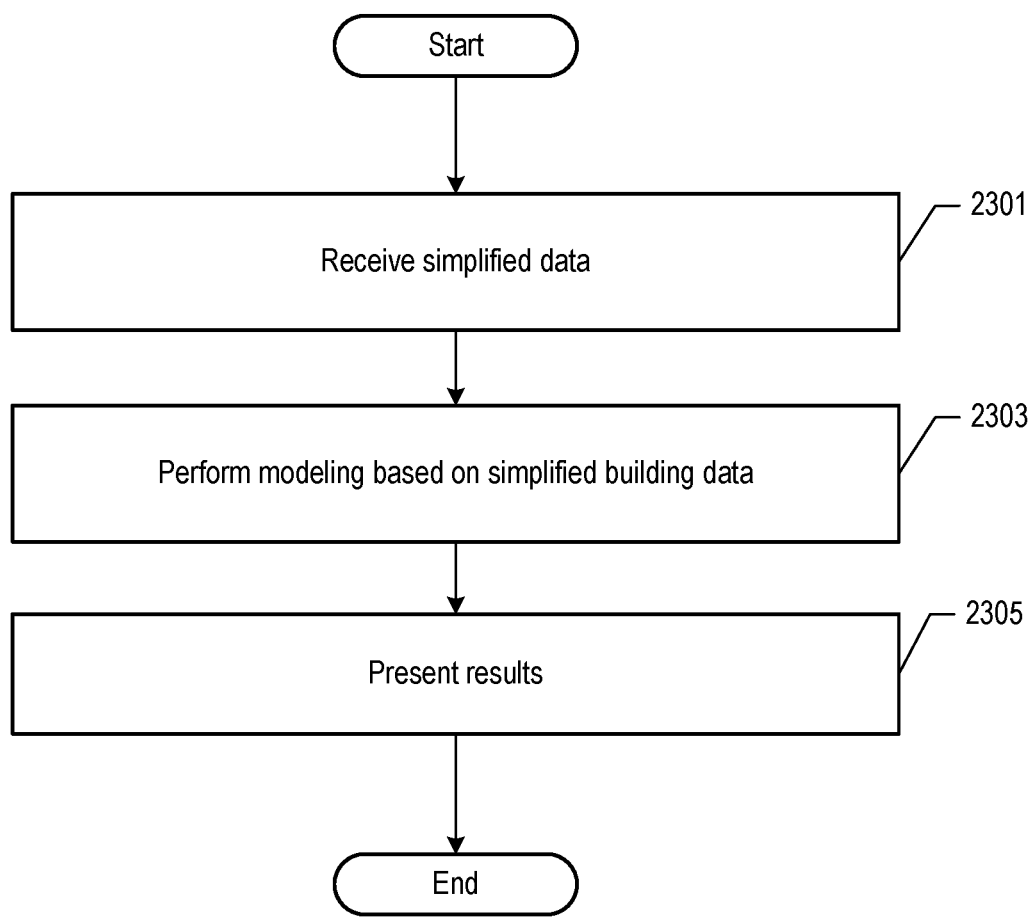
FIG. 23 depicts a flowchart of the salient processes related to performing modeling on a simplified dataset that comprises one or more joined polyhedrons.

FIG. 23 depicts a flowchart of the salient processes related to performing the modeling of a dataset that comprises one or more joined polyhedrons. The processing depicted in FIG. 23 is performed by application engine 104. As those who are skilled in the art will appreciate after reading this specification, however, this processing can be performed elsewhere or can involve something different than modeling as described earlier, or both. For example, data-processing system 201 can perform the processing as a separate software process or in a separate hardware component from that which is associated with the environment data simplification depicted in FIG. 6 and the related figures.

At task 2301, application engine 104 receives the simplified environment data from system 103.

Figure 24:
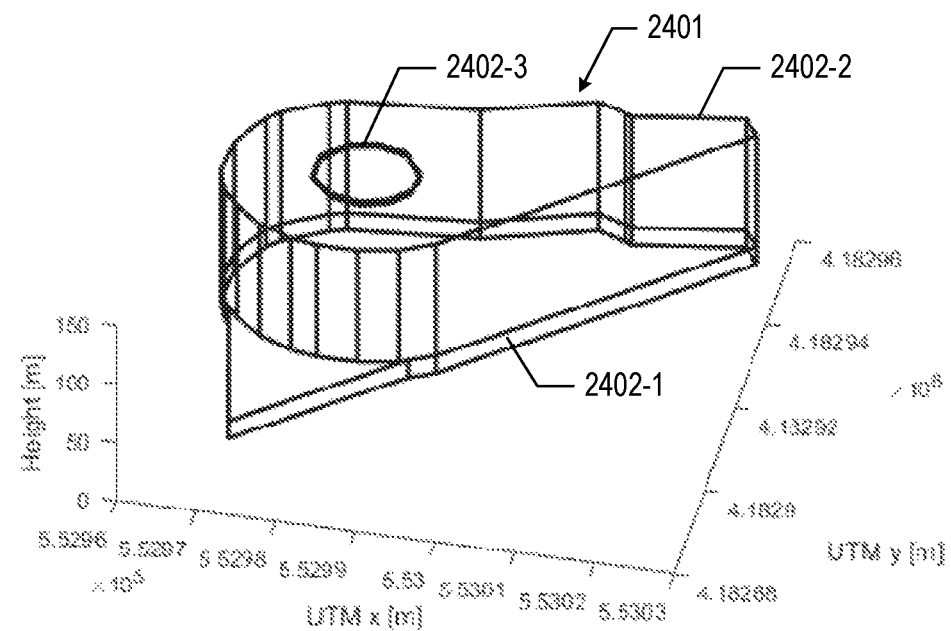
FIG. 24 depicts simplified dataset 2401.

At task 2303, application engine 104 performs modeling in well-known fashion, but based on simplified dataset 2401 in accordance with the illustrative embodiment; dataset 2401 is depicted in FIG. 24. The data in dataset 2401 for representing an environment is made up of the joined polyhedrons provided in accordance with task 609. In the simplified dataset depicted, there are only three polyhedrons having a total of 47 vertices. The three simplified polyhedrons are polyhedrons 2402-1 through 2402-3.

The simplified polyhedrons on which application engine 104 performs the modeling can be maintained in their expanded state—that is, the simplified polyhedrons are not and do not have to be shrunk back to reflect the sizes of their constituent polyhedrons that were represented in dataset 401. Moreover, the set of simplified polyhedrons on which application engine 104 performs the modeling excludes one or more polyhedrons from one or more of the previous datasets (e.g., raw dataset 401, intermediate dataset 1801, etc.) from which the polyhedrons in dataset 2401 were formed. Because of these considerations, modeling the data requires fewer computations, resulting in shorter computation time, and such an improvement in the functioning of the data-processing system that performs the modeling can be achieved without sacrificing the quality of the resulting image.

In accordance with the illustrative embodiment, the modeling performed at task 2303 supports electromagnetic wave propagation modeling. This can include generating wave propagation characteristic based on the simplified dataset. In particular, task 2303 can include determining (e.g., computing, calculating, etc.) a line-of-sight, or other type of visibility, between two points in space—that is, evaluating whether one of the points can be seen from the other at the electromagnetic wavelength under consideration in the modeling. Task 2303 can also include generating results with regard to one or more propagation characteristics such as propagation delay between two points, power level received at one point from another, angle of arrival, and delay spread, for example and without limitation.

As those who are skilled in the art will appreciate after reading this specification, however, the processing performed at task 2303 can be different than propagation modeling, as described earlier. For example and without limitation, instead of modeling electromagnetic wave propagation based on a simplified dataset 2401, application engine can:

i. perform a visualization on dataset 2401,
ii. calculate a navigation step based on dataset 2401, or
iii. perform a different type of computation based on dataset 2401.

At task 2305, application engine 104 presents to a user the results of the processing at task 2303, such as by transmitting a signal to a monitor for display of the results.

Figure 25:
FIG. 25 depicts geographic region 2501, in which the structures that are present can be represented in a simplified dataset, in accordance with the illustrative embodiment of the present invention.

FIG. 25 depicts geographic region 2501, in which the structures that are present in the geographic region can be represented in a simplified dataset, in accordance with the illustrative embodiment of the present invention. As already discussed, a benefit of simplifying the data for representing an environment is faster visibility computations, both in terms of point-to-point visibility and aggregate visibility. Regarding point-to-point visibility computations, the decrease in computation time is largely due to the decrease in the number of objects that need to be considered such as walls, which are related to the polyhedrons in the dataset. In order to demonstrate this, five target locations were arbitrarily selected, depicted as target locations 2502-1 through 2502-5; then, the time it took to determine whether these points were visible to a given source location, depicted as source location 2503, was recorded.

The visibility test was performed both using an original dataset with no dataset simplification and using a dataset on which simplification was performed according to the techniques disclosed herein. Also, the visibility test was done with a basic ray-casting algorithm, which tested whether each of the objects in the geographic region intersect the direct lines, depicted as lines 2504-1 through 2504-4, from the source location to the target locations. Overall, the computation time decreased significantly when using the simplified dataset compared to the original dataset, by around 37% in some embodiments of the present invention.

It is to be understood that the disclosure teaches just one example of the illustrative embodiment and that many variations of the invention can easily be devised by those skilled in the art after reading this disclosure and that the scope of the present invention is to be determined by the following claims.

What is claimed is:

1. A method for determining visibility between points in a geographic region in which buildings are present, the method comprising:
    receiving, by a data-processing system, a first dataset that is representative of a first building that is defined by a first polyhedron having a first polygon footprint, wherein the first dataset is characterized as having a predetermined error;
    expanding, by the data-processing system, the first polygon footprint by a factor that is based on the predetermined error, resulting in a first expanded polygon footprint;
    forming, by the data-processing system, a third polygon footprint based on determining whether the first expanded polygon footprint and a second polygon footprint in the first dataset overlap each other;
    transmitting, by the data-processing system to an application engine, a second dataset that comprises a second polyhedron and excludes the first polyhedron, wherein the second polyhedron has a footprint that comprises the third polygon footprint, and wherein the second polyhedron defines the first building in the geographic region, and wherein at least some faces of the second polyhedron define outer walls of the first building;
    calculating, by the application engine, visibility between two points in the geographic region that are represented in the second dataset, by determining whether any of the at least some faces of the second polyhedron obstruct a line-of-sight line between the two points; and
    presenting, to a user, a result that is based on the visibility calculated.

2. The method of claim 1 wherein the factor by which the first polygon footprint is expanded is further based on the wavelength of an electromagnetic wave being modeled.

3. The method of claim 1 wherein the predetermined error is characterized as a particular resolution at which the first dataset is made available.

4. The method of claim 1 wherein the factor by which the first polygon footprint is expanded does not exceed a particular amount, the amount being determined by the predetermined error.

5. The method of claim 1 wherein the expanding the first polygon footprint comprises moving a first vertex of the first polygon footprint based on a vector sum of the outward normals of adjacent edges of the first vertex.

6. The method of claim 1 wherein the second polyhedron has a height that is expanded in relation to one or more polyhedrons in the first dataset.

7. The method of claim 1 further comprising expanding, by the data-processing system, a fourth polygon footprint by the factor that is based on the predetermined error, resulting in the second polygon footprint.

8. The method of claim 1 further comprising reducing the number of vertices on the first polygon footprint prior to expanding the first polygon footprint.

9. A method for determining visibility between points in a geographic region in which buildings are present, the method comprising:
    receiving, by a data-processing system, a first dataset that is representative of a first building that is defined by a first polyhedron having a first polygon footprint, wherein the first dataset is characterized as having a predetermined error;
    expanding, by the data-processing system, i) the first polygon footprint, in part by moving a first vertex of the first polygon footprint based on a vector sum of the outward normals of adjacent edges of the first vertex, resulting in a first expanded polygon footprint, and ii) a second polygon footprint, resulting in a second expanded polygon footprint, wherein the amount by which the first vertex is moved is based on the predetermined error;
    forming, by the data-processing system, a third polygon footprint based on determining whether the first expanded polygon footprint and the second expanded polygon footprint in the first dataset overlap each other;
    transmitting, by the data-processing system to an application engine, a second dataset that comprises a second polyhedron and excludes the first polyhedron, wherein the second polyhedron has a footprint that comprises the third polygon footprint, and wherein the second polyhedron defines the first building in the geographic region, and wherein at least some faces of the second polyhedron define outer walls of the first building;
    calculating, by the application engine, visibility between two points in the geographic region that are represented in the second dataset, by determining whether any of the at least some faces of the second polyhedron obstruct a line-of-sight line between the two points; and
    presenting, to a user, a result that is based on the visibility calculated.

10. The method of claim 9 wherein the amount by which the first vertex is moved is further based on the wavelength of an electromagnetic wave being modeled.

11. The method of claim 9 wherein the calculating of visibility is part of at least one of modeling, visualization, and navigation.

12. The method of claim 9 wherein the predetermined error is characterized as a particular resolution at which the first dataset is made available.

13. The method of claim 9 wherein the factor by which the first polygon footprint is expanded does not exceed a particular amount, the amount being determined by the predetermined error.

14. The method of claim 9 wherein the second polyhedron has a height that is expanded in relation to one or more polyhedrons in the first dataset.

15. The method of claim 9 further comprising reducing the number of vertices on the first polygon footprint prior to expanding the first polygon footprint.

16. A method for determining visibility between points in a geographic region in which buildings are present, the method comprising:
    receiving, by a data-processing system, a first dataset representative of one or more buildings that are defined by i) a first polyhedron having a first polygon footprint and ii) a second polyhedron having second polygon footprint, wherein the first dataset is characterized as having a predetermined error;
    expanding, by the data-processing system, the first polygon footprint and the second polygon footprint by a factor that is based on the predetermined error, resulting in first and second expanded polygon footprints, respectively;
    forming, by the data-processing system, a third polyhedron based on determining whether the first and second expanded polygon footprints overlap each other, wherein the third polyhedron defines a first building in the geographic region, and wherein at least some faces of the third polyhedron define outer walls of the first building;
    transmitting, by the data-processing system to an application engine, a second dataset that i) comprises the third polyhedron and ii) excludes the first and second polyhedrons;
    calculating, by the application engine, visibility between two points in the geographic region that are represented in the second dataset, by determining whether any of the at least some faces of the third polyhedron obstruct a line-of-sight line between the two points; and
    presenting, to a user, a result that is based on the visibility calculated.

17. The method of claim 16 wherein the factor by which the first polygon footprint and second polygon footprint are expanded is further based on the wavelength of an electromagnetic wave being modeled.

18. The method of claim 16 wherein the predetermined error is characterized as a particular resolution at which the first dataset is made available.

19. The method of claim 16 wherein the expanding the first polygon footprint comprises moving a first vertex of the first polygon footprint based on a vector sum of the outward normals of adjacent edges of the first vertex.

20. The method of claim 16 further comprising reducing the number of vertices on the first polygon footprint prior to expanding the first polygon footprint.

* * * * *